US011309538B2

(12) United States Patent
Sadeghipari et al.

(10) Patent No.: US 11,309,538 B2
(45) Date of Patent: Apr. 19, 2022

(54) POROUS WIRE-IN-TUBE STRUCTURES

(71) Applicants: Mehrnoosh Sadeghipari, Tehran (IR); Mohammadreza Hajmirzaheydarali, Tehran (IR); Shamsoddin Mohajerzadeh, Tehran (IR); Alireza Mashayekhi, Tehran (IR); Mohammad Ala Mohajerzadeh, Tehran (IR); Ali Akhavan Farahani, Tehran (IR)

(72) Inventors: Mehrnoosh Sadeghipari, Tehran (IR); Mohammadreza Hajmirzaheydarali, Tehran (IR); Shamsoddin Mohajerzadeh, Tehran (IR); Alireza Mashayekhi, Tehran (IR); Mohammad Ala Mohajerzadeh, Tehran (IR); Ali Akhavan Farahani, Tehran (IR)

(73) Assignee: UNIVERSITY OF TEHRAN, Tehran (IR)

( * ) Notice: Subject to any disclaimer, the term of this patent is extended or adjusted under 35 U.S.C. 154(b) by 339 days.

(21) Appl. No.: 16/594,009

(22) Filed: Oct. 5, 2019

(65) Prior Publication Data

US 2020/0052284 A1    Feb. 13, 2020

Related U.S. Application Data

(60) Provisional application No. 62/742,290, filed on Oct. 6, 2018.

(51) Int. Cl.
*C30B 33/12* (2006.01)
*H01M 4/1395* (2010.01)
(Continued)

(52) U.S. Cl.
CPC ......... *H01M 4/1395* (2013.01); *C30B 29/602* (2013.01); *H01M 4/0428* (2013.01); *H01M 4/134* (2013.01); *H01M 4/661* (2013.01); *B82Y 30/00* (2013.01); *B82Y 40/00* (2013.01); *C30B 29/06* (2013.01); *C30B 29/08* (2013.01); *C30B 33/12* (2013.01); *H01M 10/0525* (2013.01);
(Continued)

(58) Field of Classification Search
CPC ....... C30B 29/602; C30B 29/06; C30B 29/08; C30B 33/12; H01M 4/0428; H01M 4/1395; H01M 4/134; H01M 4/661; B82Y 30/00; B82Y 40/00
See application file for complete search history.

(56) References Cited

U.S. PATENT DOCUMENTS

| 2012/0296124 | A1* | 11/2012 | Asefa | B01J 35/08 564/417 |
| 2018/0371631 | A1* | 12/2018 | Sun | C25D 1/006 |
| 2019/0160427 | A1* | 5/2019 | Deeba | B01J 23/63 |

* cited by examiner

*Primary Examiner* — Robert M Kunemund
(74) *Attorney, Agent, or Firm* — Bajwa IP Law Firm; Haris Zaheer Bajwa

(57) ABSTRACT

A method for fabricating porous wire-in-tube (WiT) nanostructures including forming a first porous core-shell nanostructure, forming a second porous core-shell nanostructure by increasing thickness and porosity of the porous core-shell nanostructure, and forming a porous WiT nanostructure by etching the second porous core-shell nanostructure. Forming the first porous core-shell nanostructure may include forming a porous layer on a semi-conductive core by depositing a first plurality of particles on the semi-conductive core and generating an initial porous semi-conductive core by etching the semi-conductive core simultaneously with forming the porous layer.

20 Claims, 41 Drawing Sheets

(51) Int. Cl.
  *H01M 4/04*     (2006.01)
  *H01M 4/134*    (2010.01)
  *H01M 4/66*     (2006.01)
  *C30B 29/60*    (2006.01)
  *B82Y 40/00*    (2011.01)
  *H01M 4/02*     (2006.01)
  *H01M 10/0525*  (2010.01)
  *B82Y 30/00*    (2011.01)
  *C30B 29/06*    (2006.01)
  *C30B 29/08*    (2006.01)

(52) U.S. Cl.
  CPC .......................... *H01M 2004/021* (2013.01);
                *H01M 2004/027* (2013.01)

1002

POROUS WIRE-IN-TUBE STRUCTURES

CROSS-REFERENCE TO RELATED APPLICATION

This application claims the benefit of priority from U.S. Provisional Patent Application Ser. No. 62/742,290, filed on Oct. 6, 2018, and entitled "SI-BASED POROUS WIRE-IN-TUBE NANOSTRUCTURES FOR LITHIUM-ION BATTERIES," which is incorporated herein by reference in its entirety.

TECHNICAL FIELD

The present disclosure generally relates to wire-in-tube structures, particularly to porous wire-in-tube nanostructure, and more particularly to a method and a system for fabricating porous wire-in-tube nanostructures.

BACKGROUND

Nanostructures have recently attracted great attention due to their exceptional chemical, physical, and electrical properties. Among various types of nanostructures, hollow nanostructures are of great interest because of superior properties including high surface area, low density, and high permeability. Therefore, using hollow nanostructures with large surface areas and short diffusion paths in lithium-ion batteries (LIBs) may effectively aid in tolerating large volume variation upon several cycles of charging/discharging due to their void space and provide more accessible sites between active materials and electrolytes to improve cycling stability and electrochemical reaction rate.

One-dimensional (1D) hollow nanostructures have grasped significant interest because apart from their large specific surface area and large interior void space, they may be conceived as potential building blocks in various fields such as ion-transport channels, water desalination processes, and especially energy storage devices. Also, one-dimensional (1D) semi-conductive hollow nanostructures have already been fabricated with high control over their dimensions and surface chemical compositions.

Moreover, it is believed that one-dimensional hollow nanostructures with highly porous walls may show improved electrochemical performances in comparison to their solid counterparts. However, the development of 1D hollow nanostructures coupled with highly porous walls remains a challenge. As a promising 1D material, various studies have been conducted on the fabrication of porous $Al_2O_3$ nanostructures and porous $Al_2O_3$ core-shell structures using atomic layer deposition (ALD) technique.

However, the ALD technique is an expensive method and demands further ex-situ steps to create hollow nanostructures. Thus, there is a need for a simple and cost-effective method and an effective system for fabricating porous wire-in-tube nanostructures with tunable hollowness. Moreover, there is a need for porous wire-in-tube (WiT) nanostructures with adjustable electrochemical properties.

SUMMARY

This summary is intended to provide an overview of the subject matter of the present disclosure and is not intended to identify essential elements or key elements of the subject matter, nor is it intended to be used to determine the scope of the claimed implementations. The proper scope of the present disclosure may be ascertained from the claims set forth below in view of the detailed description below and the drawings.

In one general aspect, the present disclosure describes an exemplary method for fabricating porous wire-in-tube (WiT) nanostructures. The exemplary method may include forming a first porous core-shell nanostructure, forming a second porous core-shell nanostructure by increasing thickness and porosity of the first porous core-shell nanostructure, and forming a porous WiT nanostructure by etching the second porous core-shell nanostructure. In an exemplary embodiment, forming the first porous core-shell nanostructure may include forming a porous layer on a semi-conductive core by depositing a first plurality of particles on the semi-conductive core and generating an initial porous semi-conductive core by etching the plurality of unmasked regions of the semi-conductive core simultaneously with forming the porous layer. In an exemplary embodiment, forming the porous layer may include obtaining a plurality of unmasked regions.

In an exemplary embodiment, increasing thickness and porosity of the first porous core-shell nanostructure may include repeating an iterative process until the thickness of the porous layer reaches a predefined threshold. In an exemplary embodiment, the iterative process may include increasing the thickness of the porous layer by depositing a second plurality of particles on the semi-conductive core and generating a secondary porous semi-conductive core by etching the plurality of unmasked regions of the initial porous semi-conductive core simultaneously with depositing the second plurality of particles.

In an exemplary embodiment, depositing the first plurality of particles on the semi-conductive core may include generating a plurality of metal particles by placing a metal electrode in a plasma environment with plasma power between about 100 W and about 300 W and sputtering the plurality of metal particles on the semi-conductive core by exposing the plurality of metal particles to a mixture of $O_2/H_2$ gases. In an exemplary embodiment, placing the metal electrode in the plasma environment may include placing at least one of an aluminum (Al) electrode, and a titanium (Ti) electrode in the plasma environment. In an exemplary embodiment, exposing the plurality of metal particles to the mixture of $O_2/H_2$ gases may include introducing the mixture of $O_2/H_2$ gases to the plurality of metal particles for duration between about 10 seconds and about 100 seconds.

In an exemplary embodiment, etching the plurality of unmasked regions of the semi-conductive core simultaneously with forming the porous layer may include exposing the porous layer to a mixture of $O_2/H_2$ and a fluorine-containing gas for less than about 7 seconds. In an exemplary embodiment, etching the plurality of unmasked regions of the semi-conductive core simultaneously with forming the porous layer may include introducing a mixture of $O_2/H_2/SF_6$ gases to the porous layer. In an exemplary embodiment, etching the seoncdary porous semi-conductive core may include exposing the secondary porous semi-conductive core to a fluorine-containing gas for duration between about 10 seconds and about 50 seconds with a flow rate between about 100 sccm and about 300 sccm and plasma power between about 100 W and about 300 W.

In an exemplary embodiment, repeating the iterative process until the thickness of the porous layer reaches the predefined threshold may include repeating the iterative process until the thickness of the porous layer reaches a value less than about 1000 nm. In an exemplary embodiment, repeating the iterative process until the thickness of the porous layer reaches the predefined threshold may include repeating the iterative process until the thickness of the porous layer reaches a value between about 1 nm and about 20 nm.

In an exemplary embodiment, depositing the porous layer on the semi-conductive core may include depositing the porous layer on at least one of a silicon core, a germanium core, and combinations thereof. In an exemplary embodiment, depositing the porous layer on the semi-conductive core may include depositing the porous layer with nanosized pores on the semi-conductive core. In an exemplary embodiment, depositing the porous layer on the semi-conductive core may include depositing the porous layer on a nanowire with a diameter between about 10 nm and about 500 nm.

In another general aspect, the present disclosure describes an exemplary system for fabricating porous wire-in-tube (WiT) nanostructures. The exemplary system may include a main chamber, a gas source of a plurality of gas sources, a gas inlet, a gas valve of a plurality of gas valves, a vacuum pump, a radiofrequency generator, a memory, and one or more processors. In an exemplary embodiment, the main chamber may include a substrate for holding a semi-conductive core and a pair of parallel metal electrodes. In an exemplary embodiment, the pair of parallel metal electrodes may include a top electrode configured to generate a plurality of metal particles and a ground electrode configured to hold the substrate.

In an exemplary embodiment, the gas source may be configured to contain at least one gas of a plurality of gases. In an exemplary embodiment, the plurality of gases may include $O_2$, $H_2$, and a fluorine-containing gas. In an exemplary embodiment, the fluorine-containing may include sulfur hexafluoride ($SF_6$). In an exemplary embodiment, the gas inlet may be configured to introduce a mixture of the plurality of gases into the main chamber. In an exemplary embodiment, the gas valve may be configured to couple the gas inlet with a respective gas source of the plurality of gas sources.

In an exemplary embodiment, the vacuum pump may be configured to generate a vacuum inside the main chamber. In an exemplary embodiment, the radiofrequency generator may be configured to generate a plasma environment with plasma power between about 100 W and about 300 W in the vacuum. In an exemplary embodiment, the memory may have processor-readable instructions stored therein. In an exemplary embodiment, one or more processors may be configured to access the memory and execute the processor-readable instructions, which, when executed by the one or more processors configures the one or more processors to perform the exemplary method for fabricating the porous WiT nanostructures.

In another general aspect, the present disclosure describes an exemplary wire-in-tube (WiT) nanostructure. The exemplary WiT nanostructure may include a porous nanotube, a semi-conductive nanowire embedded inside the porous nanotube, and a gap between the porous nanotube and the semi-conductive nanowire. In an exemplary embodiment, the porous nanotube may have a thickness between about 1 nm and about 20 nm and the semi-conductive nanowire may have a diameter between about 10 nm and about 500 nm. In an exemplary embodiment, the porous nanotube may include at least one of alumina, titanium dioxide, and combinations thereof. In an exemplary embodiment, the semi-conductive nanowire may include at least one of silicon, germanium, and combinations thereof. In an exemplary embodiment, the porous nanotube may include an amorphous structure. In an exemplary embodiment, the semi-conductive nanowire may include a crystalline structure.

Other exemplary systems, methods, features, and advantages of the implementations will be or will become, apparent to one of ordinary skill in the art upon examination of the following figures and detailed description. It is intended that all such additional systems, methods, features, and advantages be included within this description and this summary, be within the scope of the implementations and be protected by the claims herein.

BRIEF DESCRIPTION OF THE DRAWINGS

The drawing figures depict one or more implementations in accord with the present teachings, by way of example only, not by way of limitation. In the figures, like reference numerals refer to the same or similar elements.

DETAILED DESCRIPTION

In the following detailed description, numerous specific details are set forth by way of examples in order to provide a thorough understanding of the relevant teachings. However, it should be apparent that the present teachings may be practiced without such details. In other instances, well-known methods, procedures, components, and/or circuitry have been described at a relatively high-level, without detail, in order to avoid unnecessarily obscuring aspects of the present teachings.

The following detailed description is presented to enable a person skilled in the art to make and use the methods and devices disclosed in exemplary embodiments of the present disclosure. For purposes of explanation, specific nomenclature is set forth to provide a thorough understanding of the present disclosure. However, it will be apparent to one skilled in the art that these specific details are not required to practice the disclosed exemplary embodiments. Descriptions of specific exemplary embodiments are provided only as representative examples. Various modifications to the exemplary implementations will be readily apparent to one skilled in the art, and the general principles defined herein may be applied to other implementations and applications without departing from the scope of the present disclosure. The present disclosure is not intended to be limited to the implementations shown but is to be accorded the widest possible scope consistent with the principles and features disclosed herein.

Figure 1A:
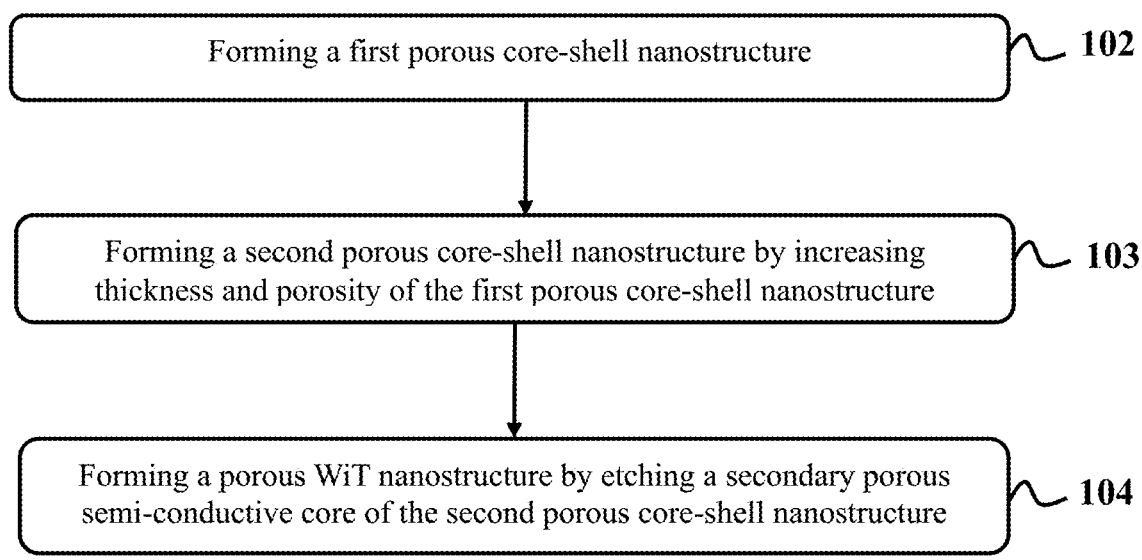
FIG. 1A shows a flowchart of an exemplary method for fabricating porous wire-in-tube nanostructures, consistent with one or more exemplary embodiments of the present disclosure.

Disclosed herein is an exemplary method and system for fabricating exemplary porous wire-in-tube structures by etching a semi-conductive core simultaneously with depositing a porous layer on the semi-conductive core. The exemplary method may provide a process to transform an array of vertical or slanted nanowires into different products including core-shell nanostructures, wire-in-tube (WiT) nanostructures, and hollow nanotubes by adjusting the etching and deposition conditions. FIG. 1A shows a flowchart of the exemplary method for fabricating exemplary porous wire-in-tube (WiT) nanostructures, consistent with one or more exemplary embodiments of the present disclosure. An exemplary method 100 may include forming a first porous core-shell nanostructure (step 102), forming a second porous core-shell nanostructure by increasing thickness and porosity of the first porous core-shell nanostructure (step 103), and forming a porous WiT nanostructure by etching the secondary porous semi-conductive core of the second porous core-shell nanostructure (step 104).

Figure 1B:
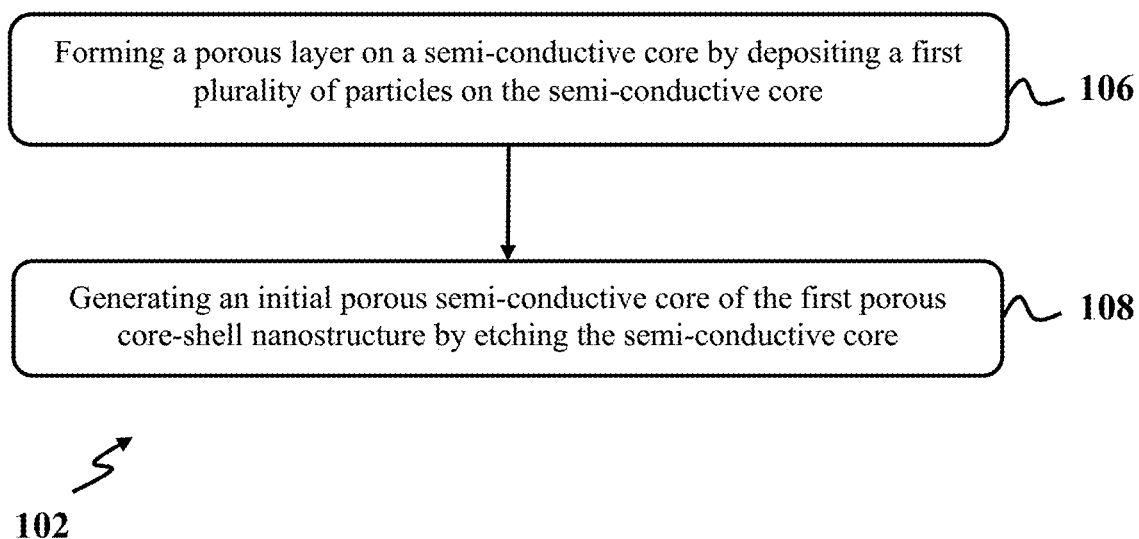
FIG. 1B shows a flowchart of an exemplary method for forming porous core-shell nanostructures, consistent with one or more exemplary embodiments of the present disclosure.

In further detail with respect to step 102, in an exemplary embodiment, the first porous core-shell nanostructure may include a shell with nanosized pores. In an exemplary embodiment, step 102 may be also implemented to form porous core-shell microstructures. FIG. 1B shows a flowchart of an exemplary method for forming the first porous core-shell nanostructure, consistent with one or more exemplary embodiments of the present disclosure. In an exemplary embodiment, FIG. 1B illustrates details of the forming step 102 of FIG. 1A. Referring to FIG. 1B, forming the first porous core-shell nanostructure may include forming a porous layer on a semi-conductive core by depositing a first plurality of particles on the semi-conductive core (step 106) and generating an initial porous semi-conductive core of the first porous core-shell nanostructure by etching the semi-conductive core simultaneously with forming the porous layer (step 108).

In further detail with respect to step 106, in an exemplary embodiment, depositing the first plurality of particles on the semi-conductive core may include obtaining a plurality of unmasked regions on the semi-conductive core. In an exemplary embodiment, each of the plurality of unmasked regions may include a portion of a surface of the semi-conductive core and the surface maybe not covered by one or more of the first plurality of particles. In an exemplary embodiment, forming the porous layer on the semi-conductive core may include forming the porous layer on at least one of a silicon core, a germanium core, and combinations thereof.

In an exemplary embodiment, forming the porous layer on the semi-conductive core may include forming the porous layer with a thickness between about 1 nm and 20 nm on the semi-conductive core. In an exemplary embodiment, forming the porous layer on a semi-conductive core may include forming the porous layer with nanosized pores. In an exemplary embodiment, forming the porous layer on a semi-conductive core may include forming the porous layer on at least one of a nanowire, a nanorod, and combinations thereof. In an exemplary embodiment, the nanowire may have with a diameter between about 10 nm and about 500 nm.

Figure 1C:
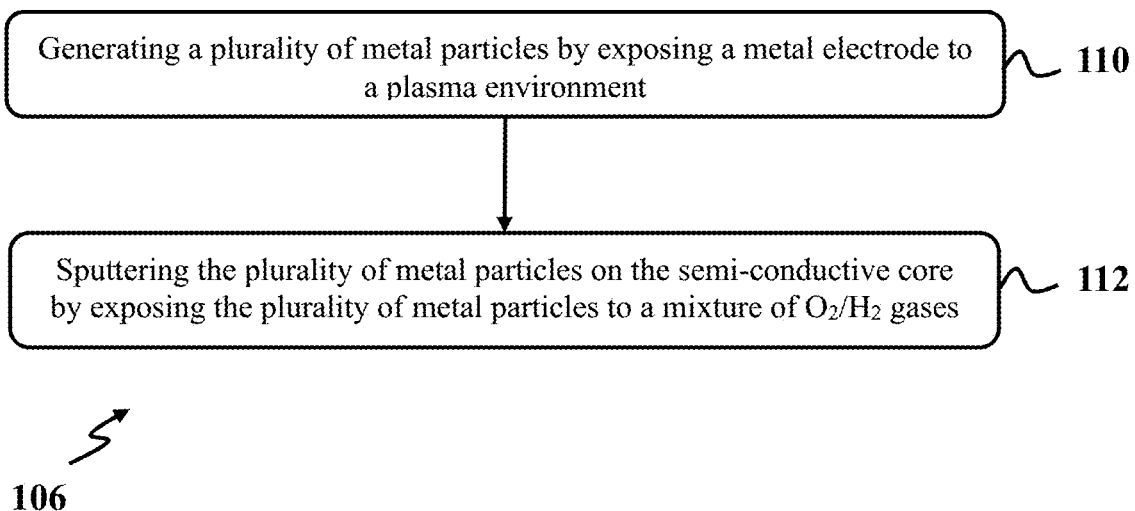
FIG. 1C shows a flowchart of an exemplary method for depositing a plurality of particles on a semi-conductive core, consistent with one or more exemplary embodiments of the present disclosure.

FIG. 1C shows a flowchart of an exemplary method for depositing the first plurality of particles on a semi-conductive core, consistent with one or more exemplary embodiments of the present disclosure. FIG. 1C illustrates details of the depositing step 106 of FIG. 1B. Referring to FIG. 1C, depositing the first plurality of particles on the semi-conductive core may include generating a plurality of metal particles by exposing a metal electrode to a plasma environment (step 110) and sputtering the plurality of metal particles on the semi-conductive core by exposing the plurality of metal particles to a mixture of $O_2/H_2$ gases (step 112).

In further detail with respect to step 110, in an exemplary embodiment, generating a plurality of metal particles may include placing a metal electrode in a plasma environment. In an exemplary embodiment, exposing the metal electrode to the plasma environment may include placing the metal electrode in the plasma environment with a plasma power between about 100 W and about 300 W. In an exemplary embodiment, exposing the metal electrode to the plasma environment may include placing at least one of an aluminum (Al) electrode, and a titanium (Ti) electrode in the plasma environment.

In further detail with respect to step 112, in an exemplary embodiment, sputtering the plurality of metal particles on the semi-conductive core may include exposing the plurality of metal particles to a mixture of $O_2/H_2$ gases. As used herein, "exposing the plurality of metal particles to a mixture of $O_2/H_2$ gases" may refer to putting the plurality of metal particles in contact with a mixture of $O_2/H_2$ gases. In an exemplary embodiment, exposing the plurality of metal particles to the mixture of $O_2/H_2$ gases may include adding the mixture of $O_2/H_2$ gases to the plurality og metal particles using through a gas inlet. In an exemplary embodiment, exposing the plurality of metal particles to the mixture of $O_2/H_2$ gases may include introducing the mixture of $O_2/H_2$ gases to the plurality of metal particles for duration between about 10 seconds and about 100 seconds.

Referring back to FIG. 1B, in further detail with respect to step 108, in an exemplary embodiment, generating the initial porous semi-conductive core by etching the semi-conductive core simultaneously with forming the porous layer may include etching the plurality of unmasked regions of the semi-conductive core simultaneously with forming the porous layer. In an exemplary embodiment, etching the plurality of unmasked regions of the semi-conductive core simultaneously with forming the porous layer may include exposing the porous layer to a mixture of $O_2/H_2$ and a fluorine-containing gas.

As used herein, "exposing porous layer to a mixture of $O_2/H_2$ and a fluorine-containing gas" may refer to putting the porous layer in contact with a mixture of $O_2/H_2$ and a fluorine-containing gas. In an exemplary embodiment, exposing the porous layer to the mixture of $O_2/H_2$ and a fluorine-containing gas may include adding the mixture of $O_2/H_2$ and a fluorine-containing gas to the porous layer. In an exemplary embodiment, exposing the porous layer to the mixture of $O_2/H_2$ and a fluorine-containing gas may include introducing the mixture of $O_2/H_2$ and a fluorine-containing gas to the porous layer for duration less than about 7 seconds. In an exemplary embodiment, the fluorine-containing gas may include sulfur hexafluoride ($SF_6$).

Referring back to FIGS. 1A and 1n further detail with respect to step 103, increasing the thickness and the porosity of the first porous core-shell nanostructure may include repeating an iterative process until the thickness of the porous layer reaches a predefined threshold. In an exemplary embodiment, repeating the iterative process until the thickness of the porous layer reaches the predefined threshold may include repeating the iterative process until the thickness of the porous layer reaches a value less than about 1000 nm. In an exemplary embodiment, repeating the iterative process until the thickness of the porous layer reaches the predefined threshold may include repeating the iterative process until the thickness of the porous layer reaches a value between about 1 nm and about 20 nm.

In an exemplary embodiment, the iterative process may include increasing the thickness of the porous layer by depositing a second plurality of particles on the semi-conductive core and generating a secondary porous semi-conductive core by etching the plurality of unmasked regions of the initial porous semi-conductive core simultaneously with depositing the second plurality of particles. In an exemplary embodiment, the iterative process may be repeated between about 70 and about 180 iterations.

Figure 1D:
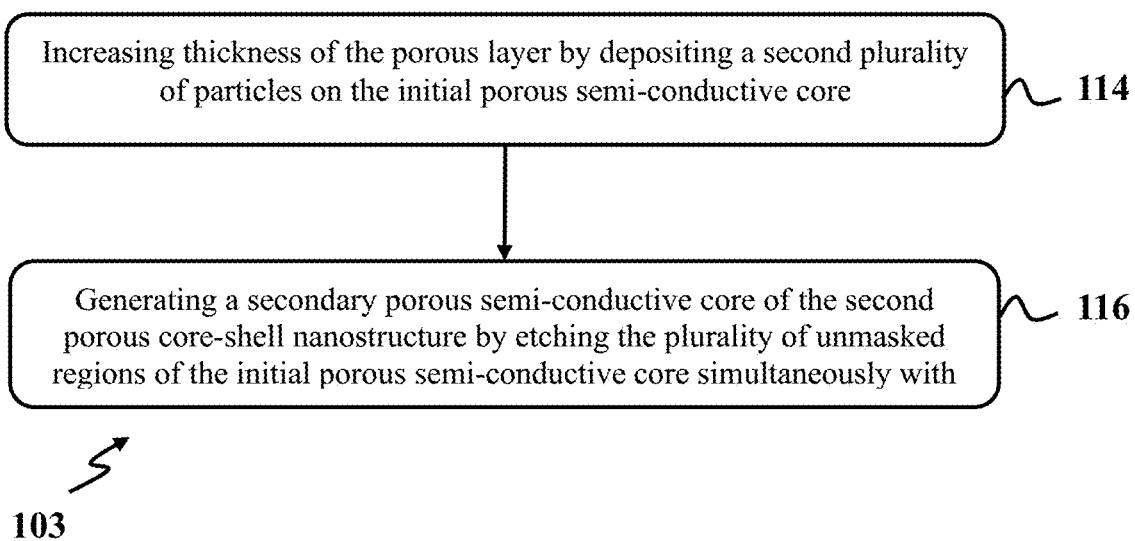
FIG. 1D shows a flowchart of an exemplary method for increasing thickness and porosity of the porous core-shell nanostructure, consistent with one or more exemplary embodiments of the present disclosure.

FIG. 1D shows a flowchart of an exemplary method for increasing thickness and porosity of the first porous core-shell nanostructure, consistent with one or more exemplary embodiments of the present disclosure. FIG. 1D illustrates details of the depositing step 103 of FIG. 1A. Referring to FIG. 1D, increasing the thickness and the porosity of the first porous core-shell nanostructure may include increasing the thickness of the porous layer by depositing a second plurality of particles on the semi-conductive core (step 114) and generating a secondary porous semi-conductive core of the second porous core-shell nanostructure by etching the plurality of unmasked regions of the initial porous semi-conductive core simultaneously with depositing the second plurality of particles (step 116). In an exemplary embodiment, step 103 may be repetitively performed until the thickness of the porous layer reaches a predefined threshold less than 1000 nm.

In an exemplary embodiment, the iterative process of step 103 for increasing the thickness and the porosity of the first porous core-shell nanostructure may be repeated for between about 70 and about 180 iterations. In an exemplary embodiment, after each iteration of step 103 thickness of the porous layer may be increased due to depositing the second plurality of particles on the semi-conductive core and porosity of the porous layer may be increased by etching the plurality of unmasked regions of the semi-conductive core simultaneously with depositing the second plurality of particles.

In an exemplary embodiment, in further detail with respect to step 114, increasing the thickness of the porous layer may include depositing the second plurality of particles on the semi-conductive core similar to step 106 of FIG. 1B. In an exemplary embodiment, in further detail with respect to step 116, generating the secondary porous semi-conductive core may include etching the plurality of unmasked regions of the initial porous semi-conductive core simultaneously with depositing the second plurality of particles similar to step 108 of FIG. 1B.

Referring back to FIGS. 1A and 1n further detail with respect to step 104, in an exemplary embodiment, forming the porous WiT nanostructure may include etching the secondary porous semi-conductive core of the porous core-shell structure. In an exemplary embodiment, etching the secondary porous semi-conductive core may include exposing the secondary porous semi-conductive core to a fluorine-containing gas for duration between about 10 seconds and about 50 seconds.

As used herein, "exposing the seoncdary porous semi-conductive core to a fluorine-containing gas" may refer to putting the secondary porous semi-conductive core in contact with a fluorine-containing gas. In an exemplary embodiment, exposing the secondary porous semi-conductive core to the fluorine-containing gas may include adding the fluorine-containing gas to the secondary porous semi-conductive core. In an exemplary embodiment, hollow nanotube with a porous structure may be generated by etching total silicon content of the secondary porous semi-conductive core. In an exemplary embodiment, etching time may depend on the nanowire diameter, and less etching time may correspond to thinner nanowires.

In an exemplary embodiment, exposing the secondary porous semi-conductive core to a fluorine-containing gas may include exposing the secondary porous semi-conductive core to $SF_6$ gas. In an exemplary embodiment, exposing the secondary porous semi-conductive core to the fluorine-containing gas may include exposing the secondary porous semi-conductive core to the fluorine-containing gas with a flow rate between about 100 standard cubic centimeters per minute (sccm) and about 300 sccm. In an exemplary embodiment, exposing the secondary porous semi-conductive core to the fluorine-containing gas may include exposing the secondary porous semi-conductive core to the fluorine-containing gas in a plasma environment with a plasma power between about 100 W and about 300 W.

In an exemplary embodiment, exemplary method 100 may further include extracting the secondary porous semi-conductive core from the porous WiT nanostructure after etching the secondary porous semi-conductive core. In an exemplary embodiment, extracting the secondary porous semi-conductive core from the porous WiT nanostructure may include extracting the secondary porous semi-conductive core through the nanosized pores of the porous layer into the plasma environment.

Figure 2:
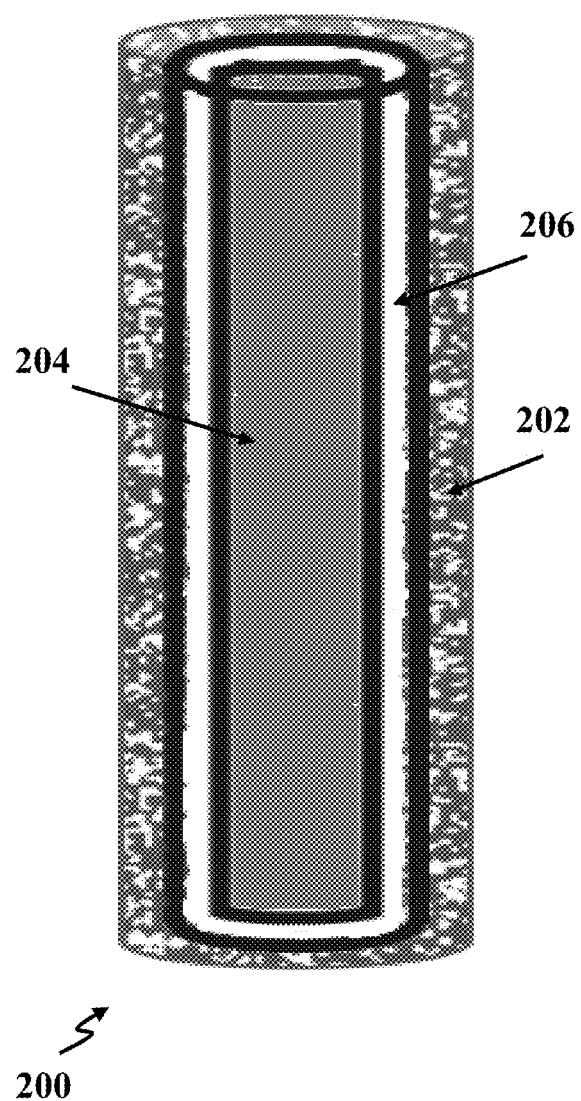
FIG. 2 shows a schematic representation of an exemplary porous wire-in-tube nanostructure, consistent with one or more exemplary embodiments of the present disclosure.

FIG. 2 shows a schematic representation of an exemplary porous wire-in-tube nanostructure 200, consistent with one or more exemplary embodiments of the present disclosure. In an exemplary embodiment, the exemplary wire-in-tube nanostructure may include a porous nanotube 202, a semi-conductive nanowire 204 embedded inside porous nanotube 202, and a gap 206 between porous nanotube 202 and semi-conductive nanowire 204. In an exemplary embodiment, exemplary porous wire-in-tube structure 200 may be used as a binder-free anode for high capacity and high rate lithium-ion batteries (LIBs). In an exemplary embodiment, porous nanotube 202 may have a thickness between about 1 nm and about 20 nm. In an exemplary embodiment, porous nanotube 202 may include least one of alumina, titanium dioxide, and combinations thereof. In an exemplary embodiment, the porous nanotube 202 may have an amorphous structure.

In an exemplary embodiment, the semi-conductive nanowire 204 may include at least one of silicon, germanium, and combinations thereof. In an exemplary embodiment, the semi-conductive nanowire 204 may have a diameter between about 10 nm and about 500 nm. In an exemplary embodiment, the semi-conductive nanowire 204 may have a crystalline structure. In an exemplary embodiment, the semi-conductive nanowire 204 with a length of at least about 20 μm.

Figure 3:
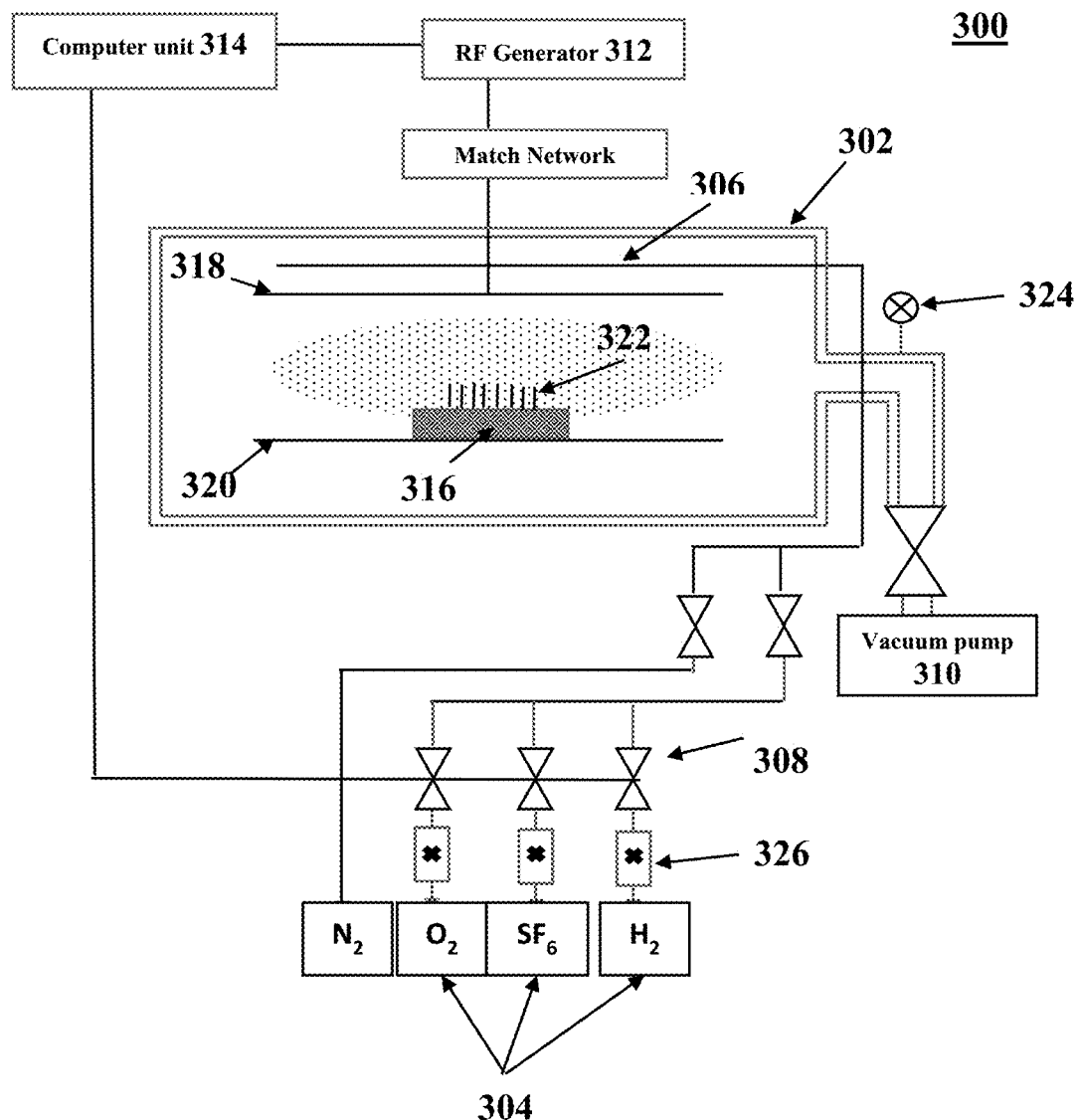
FIG. 3 shows a schematic representation of an exemplary system for fabricating wire-in-tube nanostructures, consistent with one or more exemplary embodiments of the present disclosure.

FIG. 3 shows a schematic representation of an exemplary system 300 for implementing exemplary method 100 for fabricating wire-in-tube nanostructures 200, consistent with one or more exemplary embodiments of the present disclosure. In an exemplary embodiment, different steps of method 100 may be implemented by utilizing an exemplary system 300. Exemplary system 300 may be a reactive-ion deposition and etching (RIDE) system including a capacitively-coupled plasma (CCP) reactor as a main chamber 302, a plurality of gas sources 304, a gas inlet 306, a plurality of gas valves 308, a vacuum pump 310, a radiofrequency source 312, and computer unit 314. In an exemplary embodiment, system 300 may be a reactive ion deposition and etching (RIDE) system.

In an exemplary embodiment, the main chamber 302 may include a substrate 316 and a pair of parallel metal electrodes 318 and 320. In an exemplary embodiment, substrate 316 may hold a semi-conductive core 322. In an exemplary embodiment, the pair of parallel metal electrodes may include a top electrode 318 configured to generate a plurality of metal particles to form a porous layer on a semi-conductive core and a ground electrode 320 configured to hold substrate 316. In exemplary embodiments, pair parallel metal electrodes 318 and 320 may be located at top and bottom sides of main chamber 302, respectively.

In an exemplary embodiment, a gas source of plurality of gas sources 304 may be configured to contain at least one gas of a plurality of gases. In an exemplary embodiment, the plurality of gases may include $O_2$, $H_2$, and a fluorine-containing gas. In an exemplary embodiment, gas inlet 306 may be configured to introduce a mixture of the plurality of gases into main chamber 302. In an exemplary embodiment, a gas valve of plurality of gas valves 308 may be configured to couple gas inlet 306 with a respective gas source of the plurality of gas sources 304. In an exemplary embodiment, system 300 may further include a mass flow controller 326 configured to set a flow rate of a mixture of the plurality of gases inside main chamber 302.

In an exemplary embodiment, vacuum pump 310 may be configured to generate a vacuum inside main chamber 302. In an exemplary embodiment, radiofrequency generator 312 may be a 13.56 MHz radiofrequency generator configured to generate a plasma environment with plasma power between 100 W and 300 W in the vacuum. In an exemplary embodiment, system 300 may further include a pressure transducer 324 configured to set a pressure value inside main chamber 302.

In an exemplary embodiment, computer unit 314 may include a memory having processor-readable instructions stored therein; and one or more processors configured to access the memory and execute the processor-readable instructions, which, when executed by the one or more processors configures the one or more processors to perform an exemplary method 100.

In an exemplary embodiment, depositing the plurality of particles on the semi-conductive core (step 106) may include generating a plurality of metal particles by exposing top electrode 318 to the plasma environment and sputtering the plurality of metal particles on semi-conductive core 322. In an exemplary embodiment, sputtering the plurality of metal particles on semi-conductive core 322 may include exposing the plurality of metal particles to a mixture of $O_2$ and $H_2$ for duration between about 10 seconds and about 100 seconds by adjusting each respective gas valve of the plurality of gas valves 308.

In an exemplary embodiment, etching the plurality of unmasked regions of semi-conductive core 322 simultaneously with forming the porous layer (step 108) may include exposing the porous layer to a mixture of $O_2$, $H_2$, and a fluorine-containing gas for duration less than about 7 seconds by adjusting each respective gas valve of the plurality of gas valves 308. In an exemplary embodiment, etching the secondary porous semi-conductive core (step 104) may include exposing the secondary porous semi-conductive core to the fluorine-containing gas with a flow rate between about 100 sccm and about 300 sccm for duration between about 10 seconds and about 50 seconds by adjusting each respective gas valve of the plurality of gas valves 308.

Figure 4:
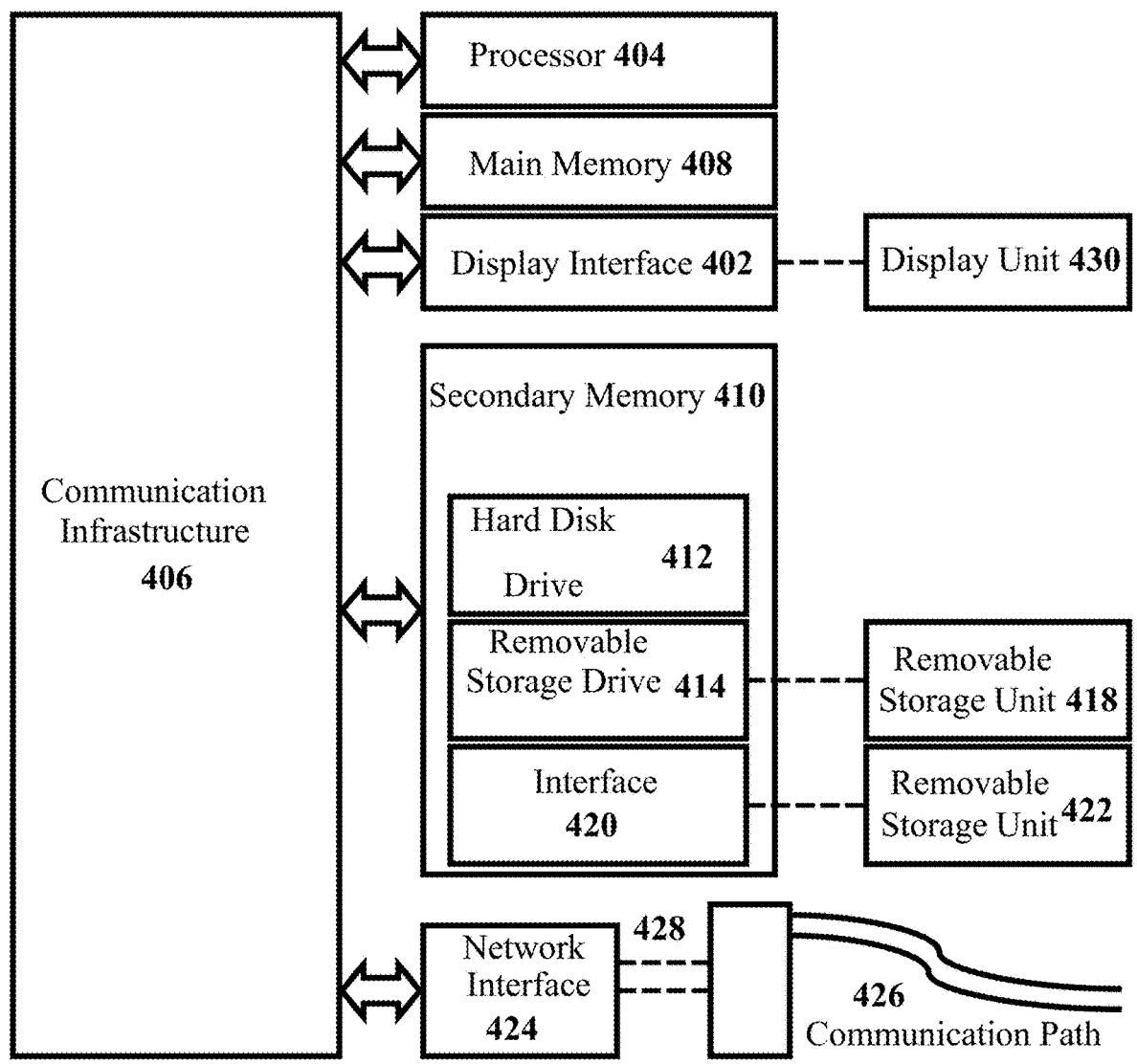
FIG. 4 shows a high-level functional block diagram of a processor, consistent with one or more exemplary embodiments of the present disclosure.

FIG. 4 shows a high-level functional block diagram of an exemplary computer unit 400 in which an embodiment of the present disclosure, or portions thereof, may be implemented as computer-readable code, consistent with exemplary embodiments of the present disclosure. For example, method 100 may be implemented in computer unit 400 using hardware, software, firmware, tangible computer-readable media having instructions stored thereon, or a combination thereof and may be implemented in one or more. Hardware, software, or any combination of such may embody any of the modules and components in FIGS. 1A-3.

If programmable logic is used, such logic may execute on a commercially available processing platform or a special purpose device. One ordinary skill in the art may appreciate that an embodiment of the disclosed subject matter can be practiced with various processor configurations, including multi-core multiprocessor systems, minicomputers, mainframe computers, computers linked or clustered with distributed functions, as well as pervasive or miniature computers that may be embedded into virtually any device.

For instance, a computing device having at least one processor device and a memory may be used to implement the above-described embodiments. A processor device may be a single processor, a plurality of processors, or combinations thereof. Processor devices may have one or more processor "cores."

An embodiment of the invention is described in terms of this example computer unit 400. After reading this description, it will become apparent to a person skilled in the relevant art how to implement the invention using other processors and/or computer architectures. Although operations may be described as a sequential process, some of the operations may, in fact, be performed in parallel, concurrently, and/or in a distributed environment, and with program code stored locally or remotely for access by single or multi-processor machines. In addition, in some embodiments, the order of operations may be rearranged without departing from the spirit of the disclosed subject matter.

Processor device 404 may be a special purpose or a general-purpose processor device. As will be appreciated by persons skilled in the relevant art, processor device 404 may also be a single processor in a multi-core/multiprocessor system, such system operating alone, or in a cluster of computing devices operating in a cluster or server farm. Processor device 404 may be connected to a communication infrastructure 406, for example, a bus, message queue, network, or multi-core message-passing scheme.

In an exemplary embodiment, computer unit 400 may include a display interface 502, for example, a video connector, to transfer data to a display unit 430, for example, a monitor. Computer unit 400 may also include a main memory 408, for example, random access memory (RAM), and may also include a secondary memory 410. Secondary memory 410 may include, for example, a hard disk drive 412, and a removable storage drive 414. Removable storage drive 414 may include a floppy disk drive, a magnetic tape drive, an optical disk drive, a flash memory, or the like. Removable storage drive 414 may read from and/or write to a removable storage unit 418 in a well-known manner. Removable storage unit 418 may include a floppy disk, a magnetic tape, an optical disk, etc., which may be read by and written to by removable storage drive 414. As will be appreciated by persons skilled in the relevant art, removable storage unit 418 may include a computer-usable storage medium having stored therein computer software and/or data.

In alternative implementations, secondary memory 410 may include other similar means for allowing computer programs or other instructions to be loaded into computer unit 400. Such means may include, for example, a removable storage unit 422 and an interface 420. Examples of such means may include a program cartridge and cartridge interface (such as that found in video game devices), a removable memory chip (such as an EPROM, or PROM) and associated socket, and other removable storage units 422 and interfaces 420 which allow software and data to be transferred from removable storage unit 422 to computer unit 400.

Computer unit 400 may also include a communications interface 424. Communications interface 424 allows software and data to be transferred between computer unit 400 and external devices. Communications interface 424 may include a modem, a network interface (such as an Ethernet card), a communications port, a PCMCIA slot, and card, or the like. Software and data transferred via communications interface 424 may be in the form of signals, which may be electronic, electromagnetic, optical, or other signals capable of being received by communications interface 424. These signals may be provided to communications interface 424 via a communications path 426. Communications path 426 carries signals and may be implemented using wire or cable, fiber optics, a phone line, a cellular phone link, an RF link or other communications channels.

In this document, the terms "computer program medium" and "computer usable medium" are used to generally refer to media such as removable storage unit 418, removable storage unit 422, and a hard disk installed in hard disk drive 412. Computer program medium and computer usable medium may also refer to memories, such as main memory 408 and secondary memory 410, which may be memory semiconductors (e.g. DRAMs, etc.).

Computer programs (also called computer control logic) are stored in main memory 408 and/or secondary memory 410. Computer programs may also be received via communications interface 424. Such computer programs, when executed, enable computer unit 400 to implement different embodiments of the present disclosure as discussed herein. In particular, the computer programs, when executed, enable processor device 404 to implement the processes of the present disclosure, such as the operations in method 100 illustrated by flowchart 100 of FIG. 1A discussed above. Accordingly, such computer programs represent controllers of computer unit 400. Where an exemplary embodiment of method 100 is implemented using software, the software may be stored in a computer program product and loaded into computer unit 400 using removable storage drive 414, interface 420, and hard disk drive 412, or communications interface 424.

Embodiments of the present disclosure also may be directed to computer program products including software stored on any computer useable medium. Such software, when executed in one or more data processing device, causes a data processing device to operate as described herein. An embodiment of the present disclosure may employ any computer useable or readable medium. Examples of computer useable mediums include, but are not limited to, primary storage devices (e.g., any type of random access memory), secondary storage devices (e.g., hard drives, floppy disks, CD ROMS, ZIP disks, tapes, magnetic storage devices, and optical storage devices, MEMS, nanotechnological storage device, etc.).

The embodiments have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

EXAMPLES

Example 1: Fabrication of the Exemplary Wire-in-Tube Nanostructure

In this example, the exemplary wire-in-tube nanostructures were fabricated through an exemplary method similar to method 100. At first, SiNWs were grown on a silicon (Si) substrate using a chemical vapor deposition (CVD) method. The Si substrate was coated with a thin layer of gold with a thickness between about 5 nm and about 10 nm before SiNW synthesis. After that, the gold-coated substrate was placed in a low-pressure chemical vapor deposition (LPCVD) reactor at a base pressure of about 2.5 mTorr and at a temperature of about 600° C. During the early stages of the SiNW growth, the gold (Au) layer was converted into Au—Si droplets which act as a catalyst for the subsequent steps. The growth of SiNWs was initiated after introducing silane (SiH4) as a silicon precursor with a flow rate of about 20 standard cubic centimeters per minute (sccm). In this process, the growth of the SiNWs was based on a vapor-liquid-solid (VLS) mechanism.

Figure 5A:
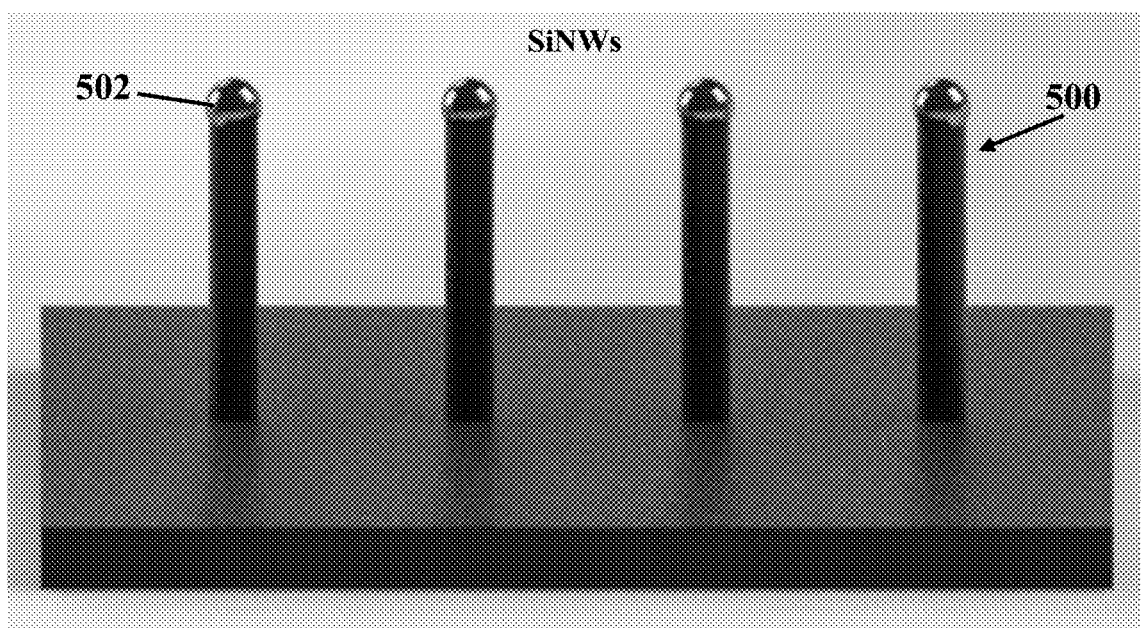
FIG. 5A shows an array of silicon nanowires (SiNWs) on a silicon substrate, consistent with one or more exemplary embodiments of the present disclosure.
Figure 5B:
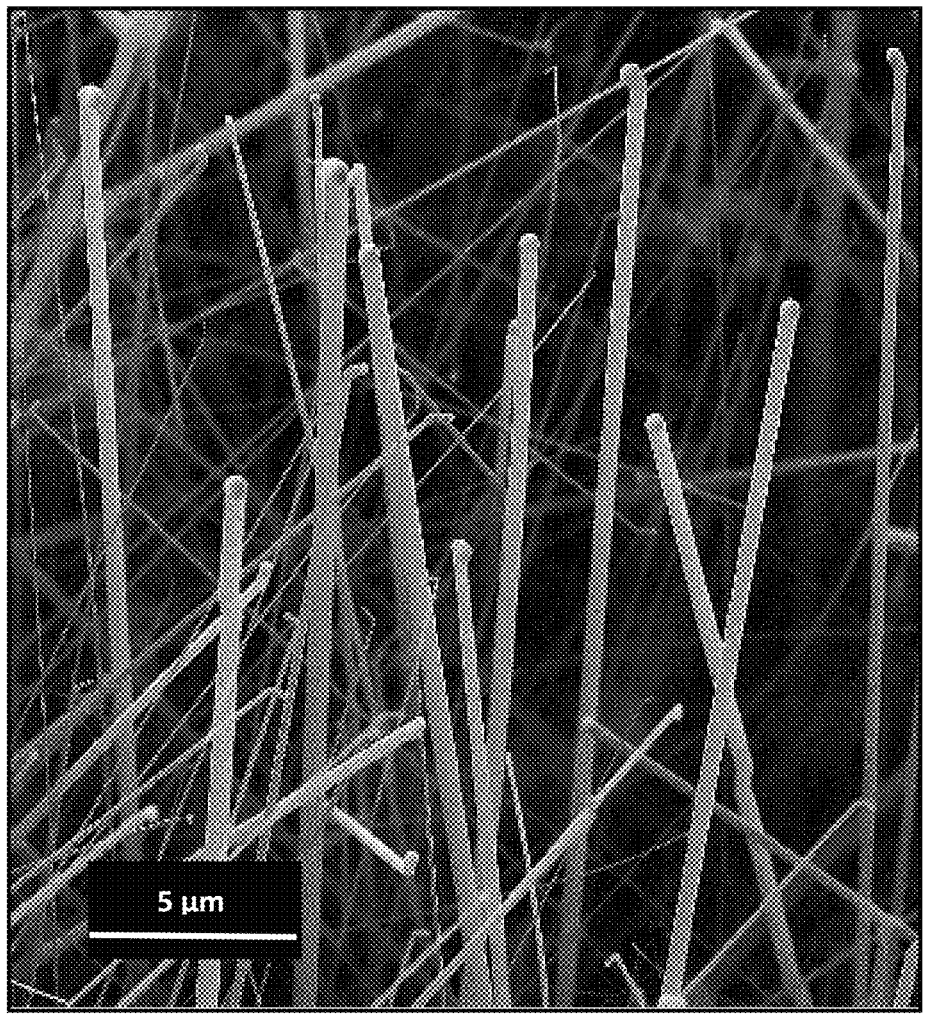
FIG. 5B shows tilted view (45°) of a scanning electron microscope (SEM) image of SiNWs grown on a silicon substrate through a vapor-liquid-solid (VLS) mechanism, consistent with one or more exemplary embodiments of the present disclosure.

FIG. 5A shows an array of silicon nanowires (SiNWs) 500 grown on a Si substrate, consistent with one or more exemplary embodiments of the present disclosure. Referring to FIG. 5A, there is a bright spot of gold nanoparticles 502 at the tip of SiNWs 500. The gold nanoparticles 502 were used as the catalyst for the growth of SiNWs 500. FIG. 5B shows tilted view (45°) of a scanning electron microscope (SEM) image of SiNWs grown on a Si substrate through a vapor-liquid-solid (VLS) mechanism, consistent with one or more exemplary embodiments of the present disclosure. Referring to FIG. 5B, the SiNWs have a diameter between about 10 nm and about 500 nm. The growth direction of SiNWs is mostly along <111> and <110> planes. It should be noted that by controlling the growth parameters, such as the thickness of the catalyst layer, growth time, and reactor pressure, the diameter of the SiNWs may be tuned.

In the next step, first porous core-shell nanostructures of SiNWs in porous alumina ($Al_2O_3$) tubes were formed by forming a porous $Al_2O_3$ layer on the SiNW by depositing a plurality of particles on the SiNW and generating a porous SiNW by etching the SiNW. Forming the porous SiNW-$Al_2O_3$ core-shell nanostructures included two sub-steps which were called passivation steps. The passivation steps consisted of forming a porous $Al_2O_3$ nanotube by depositing a porous $Al_2O_3$ layer on a surface of each SiNW which obtained a plurality of unmasked regions on each SiNW and generating a porous SiNW by etching the plurality of unmasked regions of each SiNW simultaneously with depositing the porous $Al_2O_3$ layer. In order to form the porous $Al_2O_3$ nanotubes embedding each SiNW, the silicon nanowires (SiNWs) were loaded into system 300 as described in FIG. 3. The system 300 which was used in this example included a capacitively coupled plasma (CCP)

reactor where two parallel aluminum (Al) plates were located at top and bottom sides.

In the RIDE system, the SiNWs were exposed to three gases entailing oxygen, hydrogen, and sulfur hexafluoride ($SF_6$), in a programmable control manner and in a plasma environment. It may be assumed that a high flow rate of hydrogen during two passivation steps may be responsible for the deposition of a thin and conformal layer of alumina around each SiNW. Since the top and bottom electrodes in the etching setup were made of aluminum (Al), aluminum was randomly sputtered on the SiNWs in the plasma environment through an electrode bombardment process.

In the first passivation step and after loading SiNWs into the RIDE system, an ultrathin porous $Al_2O_3$ layer with a thickness between about 4 nm and about 8 nm was deposited on the surface of the SiNWs through introducing a mixture of $O_2/H_2$ gases to the reactor with duration of about 23 seconds and a plasma power of about 200 W. As a result of deposition, an amorphous $Al_2O_3$ layer was deposited and a plurality of unmasked regions was created on the surface of SiNWs which was not covered by $Al_2O_3$.

In the second passivation step, a concurrent mixture of $O_2/SF_6/H_2$ gases was flown into the reactor with duration of about 5 seconds and a plasma power of about 200 W. The presence of $SF_6$ during the second passivation step was responsible for etching the unmasked regions of the SiNWs which made the SiNWs porous. Therefore, using $SF_6$ along $H_2$ during the second passivation step resulted in simultaneous deposition of $Al_2O_3$ and etching of the SiNW.

In the next step, second porous $SiNW-Al_2O_3$ core-shell nanostructures was formed by increasing thickness and porosity of the first porous $SiNW-Al_2O_3$ core-shell nanostructures through repeating an iterative process until the thickness of the porous $Al_2O_3$ layer reached a value of about 18 nm. The iterative process included sequentially repeating the first passivation step and the second passivation step for about 140 iterations.

Figure 5C:
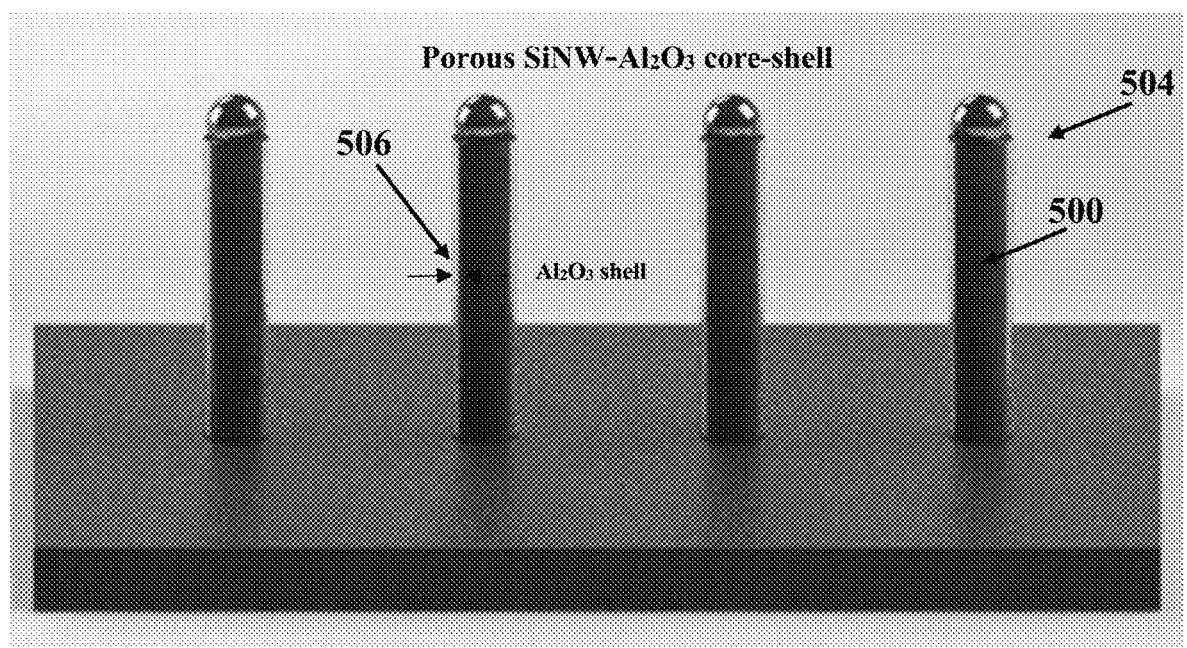
FIG. 5C shows an array of porous SiNW-$Al_2O_3$ core-shell nanostructures on a silicon substrate, consistent with one or more exemplary embodiments of the present disclosure.

FIG. 5C shows an array of porous $SiNW-Al_2O_3$ core-shell nanostructures 504 on the silicon substrate, consistent with one or more exemplary embodiments of the present disclosure. Referring to FIG. 5C, there is outer shell 506 which is an ultrathin porous $Al_2O_3$ layer around each SiNW 500.

In the next step, a porous $Si-in-Al_2O_3$ wire-in-tube (WiT) nanostructure was formed by etching the SiNW of the second porous core-shell nanostructure. During the etching step which takes between about 15 seconds and about 25 seconds, only the $SF_6$ plasma was used to partially remove the Si content of each SiNW. The plasma power was set at about 180 W and the flow rate of $SF_6$ was about 150 sccm. It should be noted that etching time may be set based on the diameter of the synthesized SiNWs.

Figure 5D:
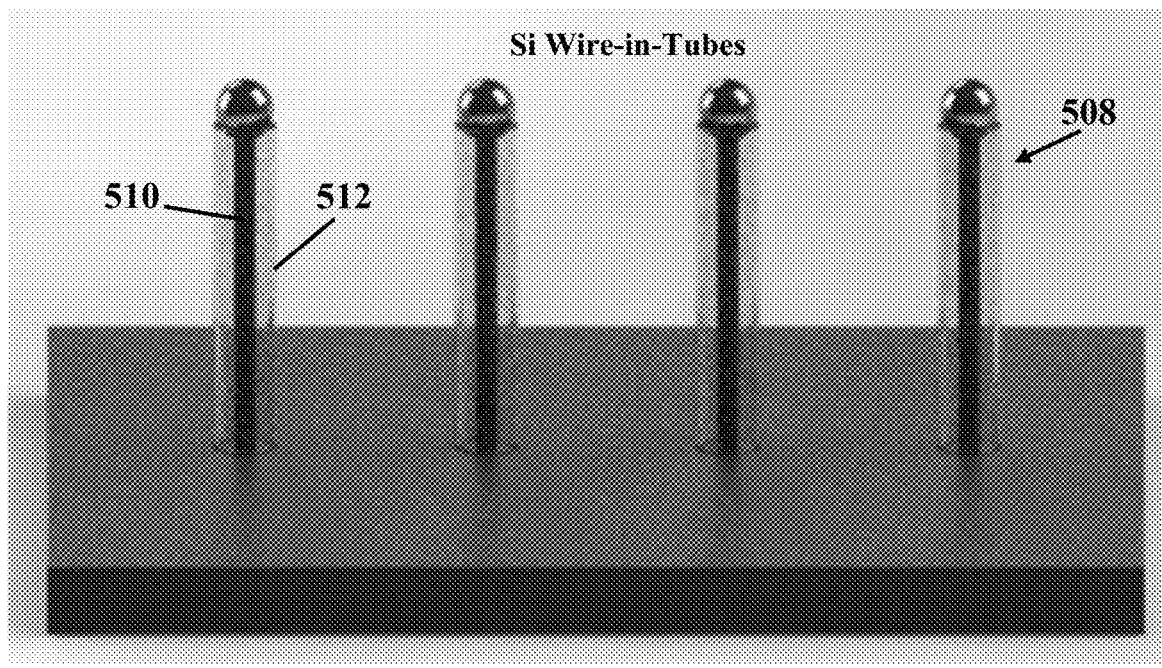
FIG. 5D shows an array of porous SiNW-$Al_2O_3$ wire-in-tube nanostructures on a silicon substrate, consistent with one or more exemplary embodiments of the present disclosure.

During the etching step, free Si content was extracted through nanosized pores of the porous $Al_2O_3$ layer by fluorine ions present in a plasma environment of the RIDE system. Therefore, the nanosized pores on the surfaces of the alumina nanotube were the extraction sites for the etched silicon content. After performing the etching step and extracting the free Si content, WiT nanostructures including the SiNWs in hollow $Al_2O_3$ nanotubes with porous structures were obtained. FIG. 5D shows an array of porous $Si-in-Al_2O_3$ WiT nanostructures 508 on a silicon substrate, consistent with one or more exemplary embodiments of the present disclosure. Referring to FIG. 5D, porous $Si-in-Al_2O_3$ WiT nanostructures 508 includes partially etched SiNWs 510 in hollow $Al_2O_3$ nanotubes 512 with porous structures.

Figure 5E:
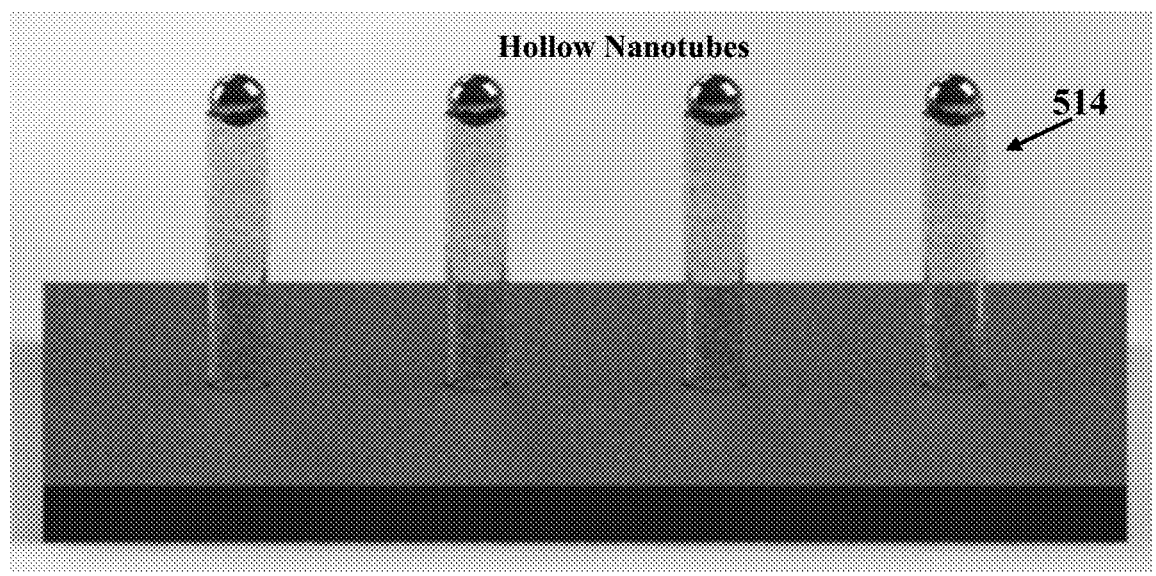
FIG. 5E shows an array of hollow $Al_2O_3$ nanotubes on a silicon substrate, consistent with one or more exemplary embodiments of the present disclosure.

By continuing the etching step, the total silicon content of porous $Si-in-Al_2O_3$ WiT nanostructures 508 was extracted and fully hollow $Al_2O_3$ nanotubes with a porous structure were obtained. FIG. 5E shows an array of hollow $Al_2O_3$ nanotubes 514 on a silicon substrate, consistent with one or more exemplary embodiments of the present disclosure. Referring to FIGS. 5D-5E, porous $SiNW-Al_2O_3$ WiT nanostructures 508 and hollow $Al_2O_3$ nanotubes 514 were well-aligned and preserved the orientation and length of SiNWs 500 as shown in FIG. 5A. Also, gold nanoparticles 502 remain intact during the etching and passivation steps.

Figure 6A:
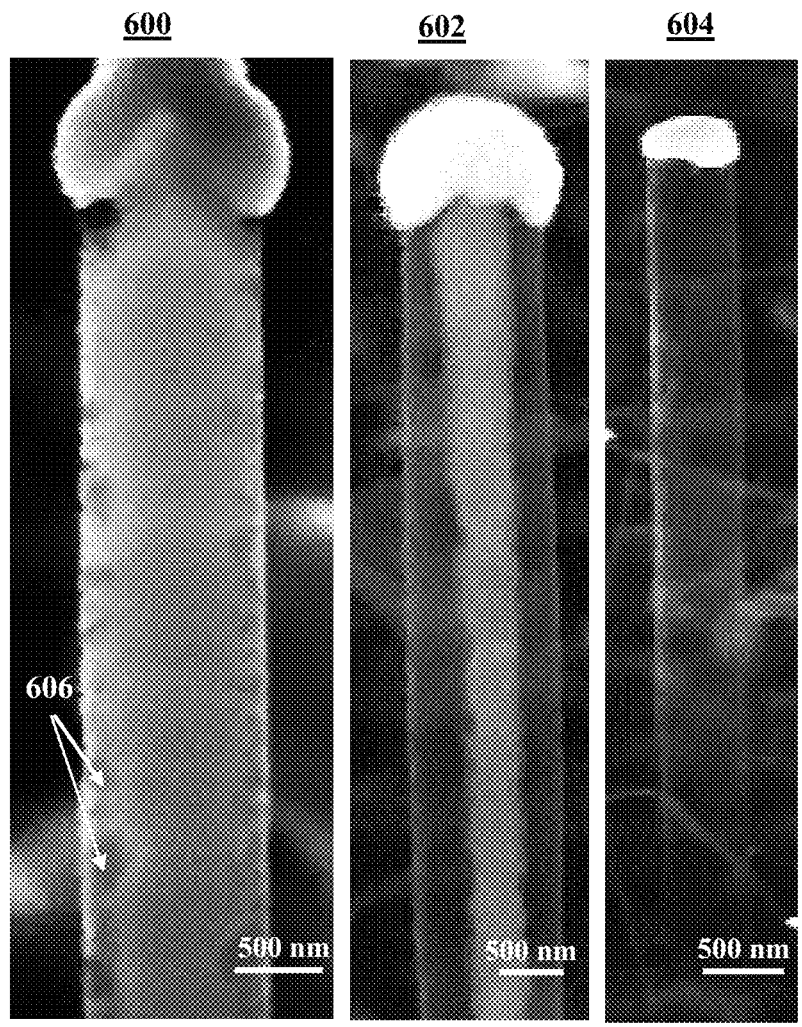
FIG. 6A shows SEM images of products fabricated with different etching times, consistent with one or more exemplary embodiments of the present disclosure.

FIG. 6A shows SEM images of nanostructures fabricated with an etching time of about 10 seconds 600, about 18 seconds 602, and about 25 seconds 604, consistent with one or more exemplary embodiments of the present disclosure. Referring to FIG. 6A, after 10 seconds of etching, unmasked regions of the SiNW 600 are exposed to the $SF_6$ gas and Si content would be extracted from unmasked regions 606 which are the first zones of the extraction. After 18 seconds of etching, extraction progresses to all around of the side walls in the unmasked regions and the Si content decreases which forms a wire-in-tube (WiT) nanostructure 602. After 25 seconds of etching, the whole silicon content is extracted while the alumina nanotube may be unaltered, and hollow alumina nanotube 604 is formed.

Figure 6B:
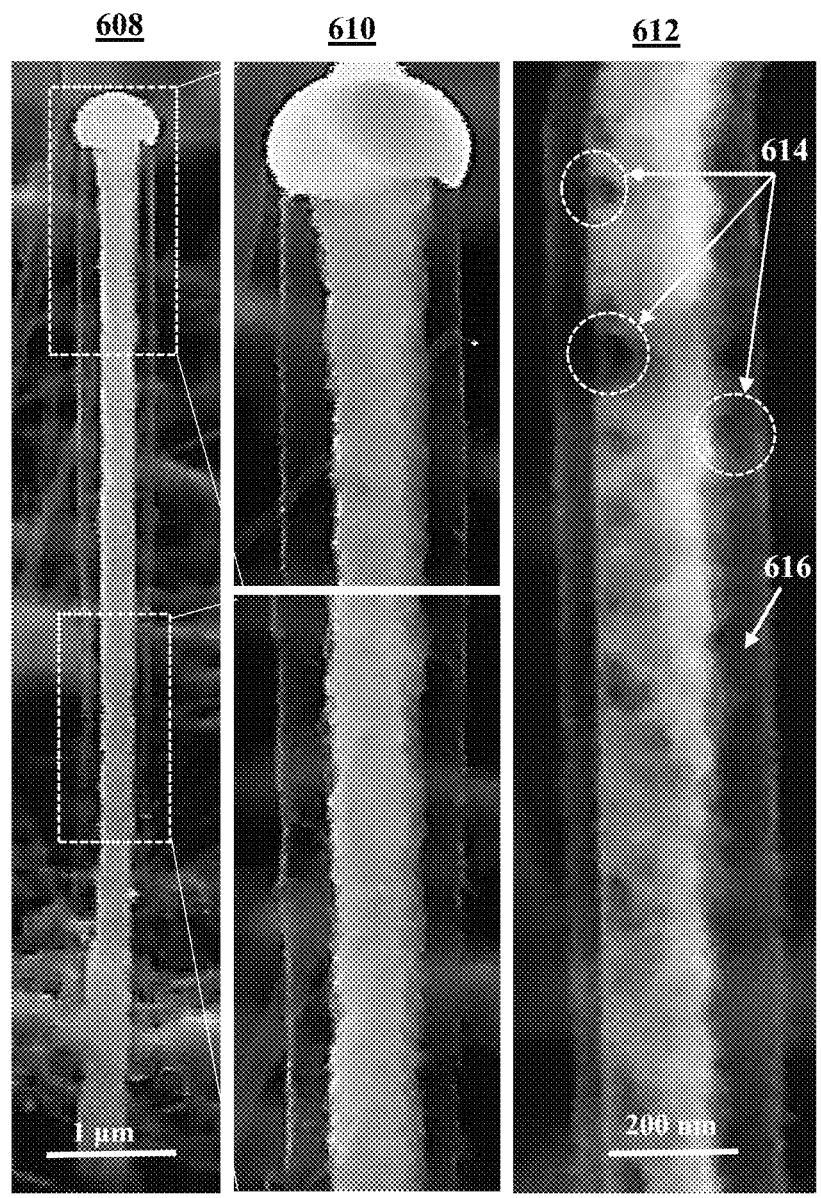
FIG. 6B shows an SEM image of an etching process of WiT nanostructure, a magnified view of two sections of WiT nanostructure, and a 5-fold magnified image of WiT nanostructure with scallops on the sidewalls of the SiNW, consistent with one or more exemplary embodiments of the present disclosure.

FIG. 6B shows an SEM image of an etching process of WiT nanostructure 608, a magnified view of two sections 610 of WiT nanostructure 608, and a 5-fold magnified image of exemplary WiT nanostructure 608 with scallops on the core sidewalls 612, consistent with one or more exemplary embodiments of the present disclosure. Referring to FIG. 6B, WiT nanostructure 608 and its magnified view 610 show the uniformity of the SiNW within the porous $Al_2O_3$ tube. Also, presence of scallops 614 in the sidewalls of WiT nanostructure 612 indicates strong local electrical fields at the edge of porous alumina nanotube 616 which causes an ion bowing phenomenon.

Figure 7A:
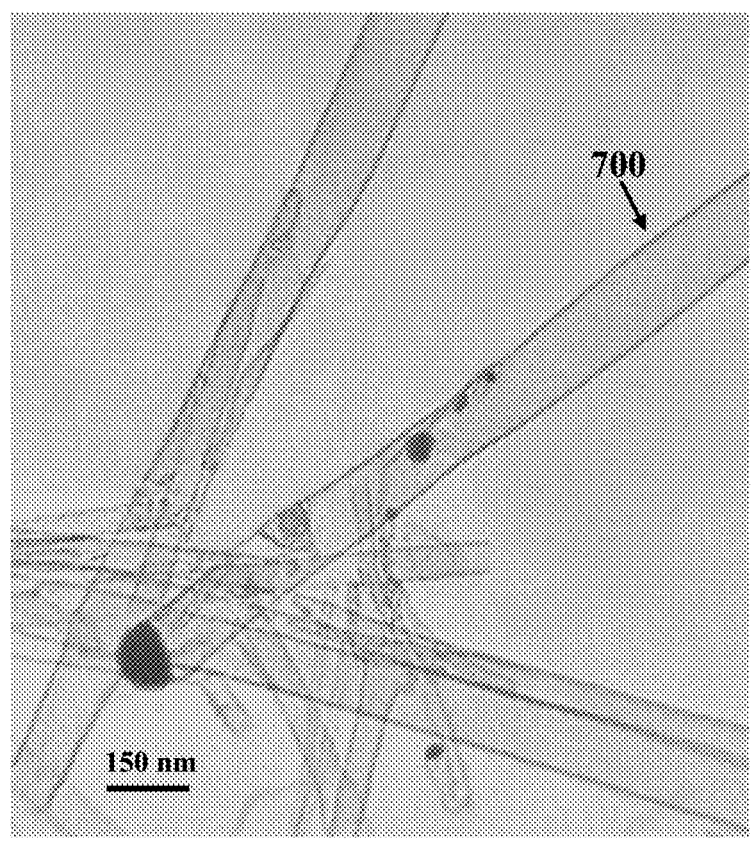
FIG. 7A shows a transmission electron microscopy (TEM) image of thick $Al_2O_3$ hollow nanotubes, consistent with one or more exemplary embodiments of the present disclosure.
Figure 7B:
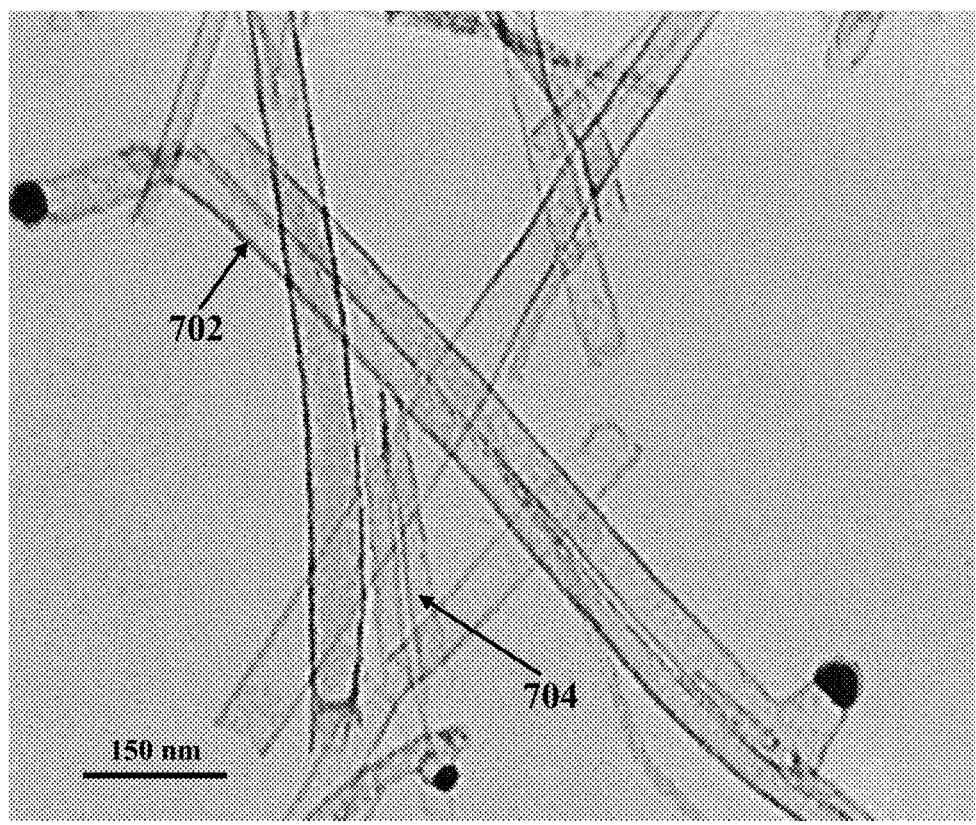
FIG. 7B shows a transmission electron microscopy (TEM) image of thin $Al_2O_3$ hollow nanotubes, consistent with one or more exemplary embodiments of the present disclosure.
Figure 7C:
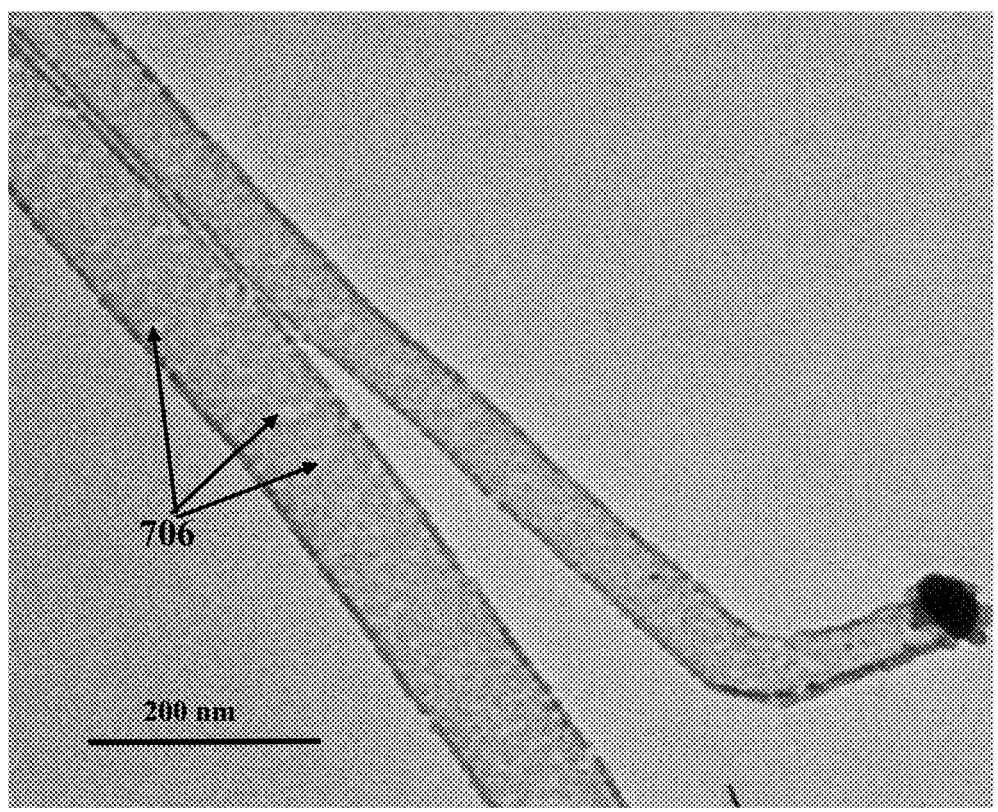
FIG. 7C shows a TEM image of a porous $Al_2O_3$ hollow nanotube, consistent with one or more exemplary embodiments of the present disclosure.

It should be noted that based on the diameter of the SiNWs, the alumina nanotubes may have different diameters. For instance, FIGS. 7A and 7B show thick and thin alumina nanotubes. FIG. 7A shows a transmission electron microscopy (TEM) image of thick $Al_2O_3$ hollow nanotubes, consistent with one or more exemplary embodiments of the present disclosure. Referring to FIG. 7A, $Al_2O_3$ nanotube 700 has a diameter of about 130 nm with a hollow structure. FIG. 7B shows a transmission electron microscopy (TEM) image of thin $Al_2O_3$ hollow nanotubes, consistent with one or more exemplary embodiments of the present disclosure. Referring to FIG. 7B, $Al_2O_3$ nanotubes 702 and 704 have hollow structures with a diameter of about 40 nm and about 18 nm, respectively. FIG. 7C shows a TEM image of porous $Al_2O_3$ hollow nanotubes, consistent with one or more exemplary embodiments of the present disclosure. Referring to FIG. 7C, the porous $Al_2O_3$ hollow nanotubes synthesized based on exemplary method 100 have a perforated structure with nanosized pores 706.

Figure 8A:
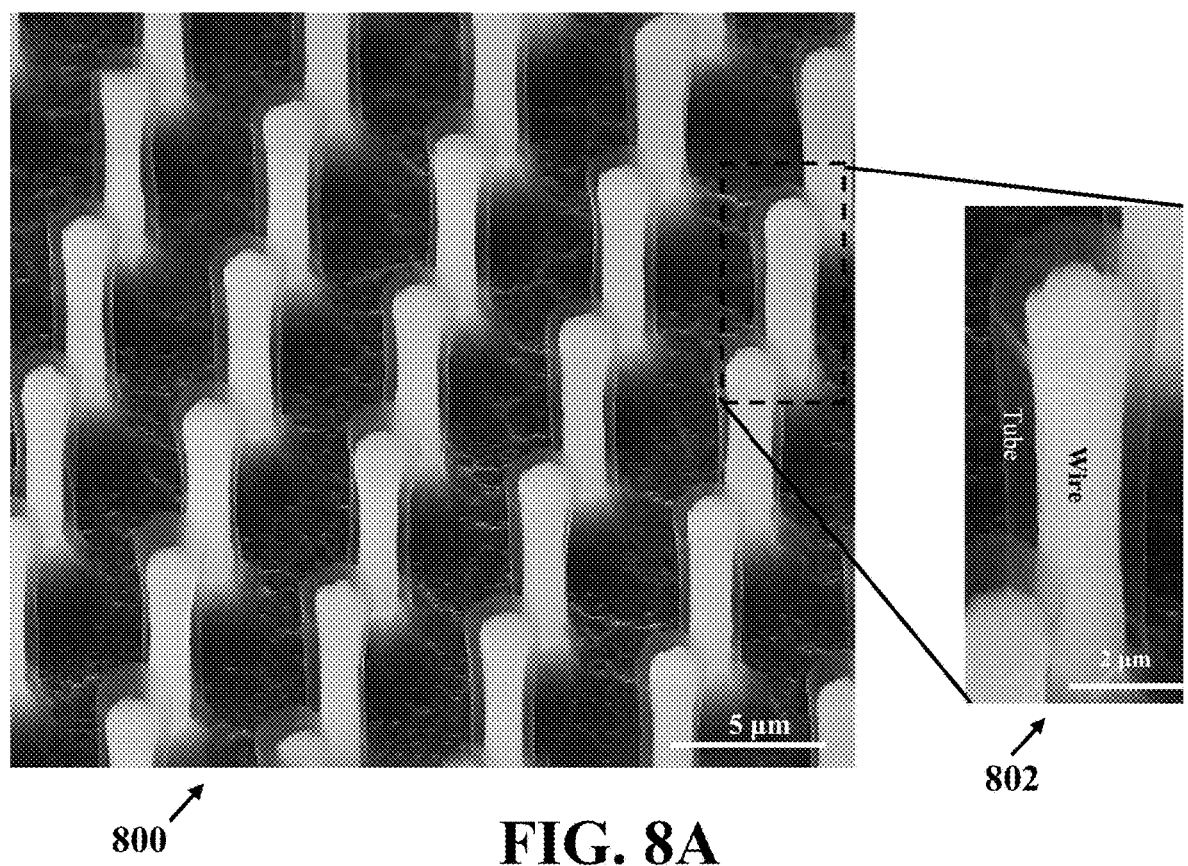
FIG. 8A shows a tilted view of an SEM image of an array of exemplary WiT microstructures, consistent with one or more exemplary embodiments of the present disclosure.
Figure 8B:
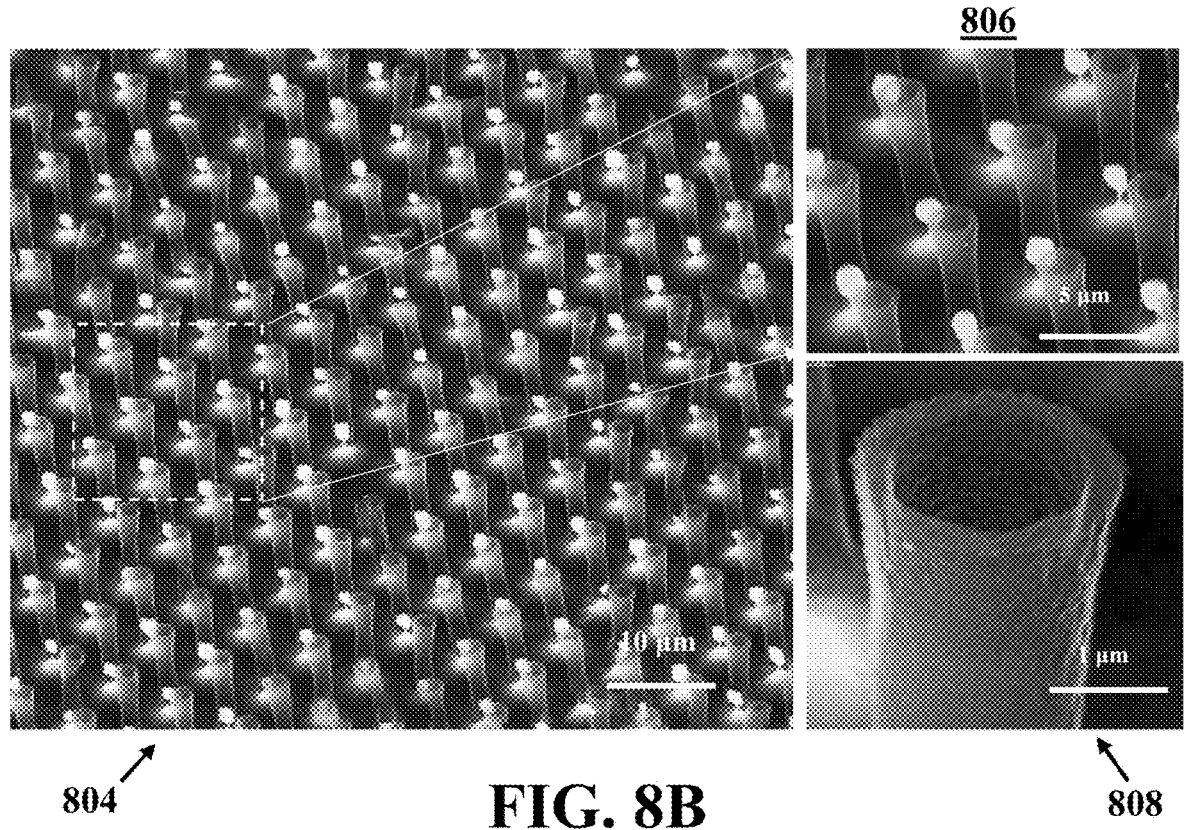
FIG. 8B shows tilted view SEM images of an array of $Al_2O_3$ hollow microtubes, a 2-fold magnified view, and a 10-fold magnified view of a hollow microtube, consistent with one or more exemplary embodiments of the present disclosure.

The exemplary method 100 may also be utilized for fabricating WiT microstructures and hollow microtube. FIG. 8A shows tilted view of an SEM image of an array of exemplary WiT microstructures 800 and a magnified WiT microstructure 802, consistent with one or more exemplary embodiments of the present disclosure. Referring to FIG. 8A, the exemplary WiT microstructures 800 have a uniform structure including a hollow alumina microtube embedding a silicon microwire. FIG. 8B shows tilted view SEM images of an array of $Al_2O_3$ hollow microtubes 804, a 2-fold magnified view 806, and a 10-fold magnified view 808 of a hollow microtube, consistent with one or more exemplary embodiments of the present disclosure. Referring to FIG. 8B, all the $Al_2O_3$ microtubes are fully hollow and have uniform structures.

Figure 9A:
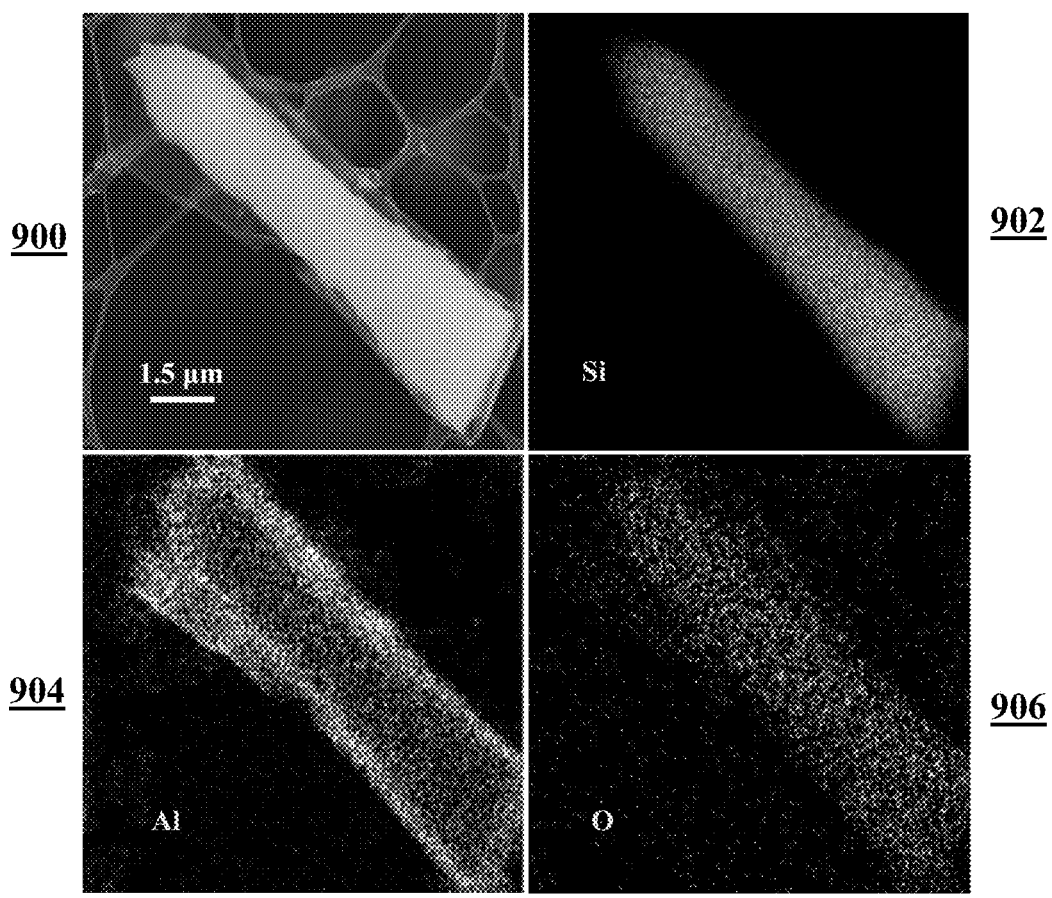
FIG. 9A shows an SEM image and energy-dispersive X-ray spectroscopy (EDS) elemental mapping of Si, Al, and O of an exemplary wire-in-tube (WiT) nanostructure, consistent with one or more exemplary embodiments of the present disclosure.

Example 2: Elemental Composition of the Exemplary Wire-in-Tube Microstrcture In this example, the elemental composition of the exemplary wire-in-tube microstructure was analyzed by energy-dispersive X-ray spectroscopy (EDS) method. In order to perform the EDS method, the WiT microstructure were scratched from the surface on a lacey grid to eliminate Si substrate effect. FIG. 9A shows an SEM image 900 and energy-dispersive X-ray spectroscopy (EDS) elemental mapping of Si 902, Al 904, and O 906 of an exemplary wire-in-tube (WiT) microstructure, consistent with one or more exemplary embodiments of the present disclosure. Referring to FIG. 9A, elemental mapping of Si 902, Al 904, and O 906 of the exemplary WiT microstructure clearly reveals that the Si wire is located in the center of the composite and encapsulated by a thin $Al_2O_3$ tube. Elemental mapping data also reveal that there is void space between the Si wire and the thin $Al_2O_3$ tube.

Figure 9B:
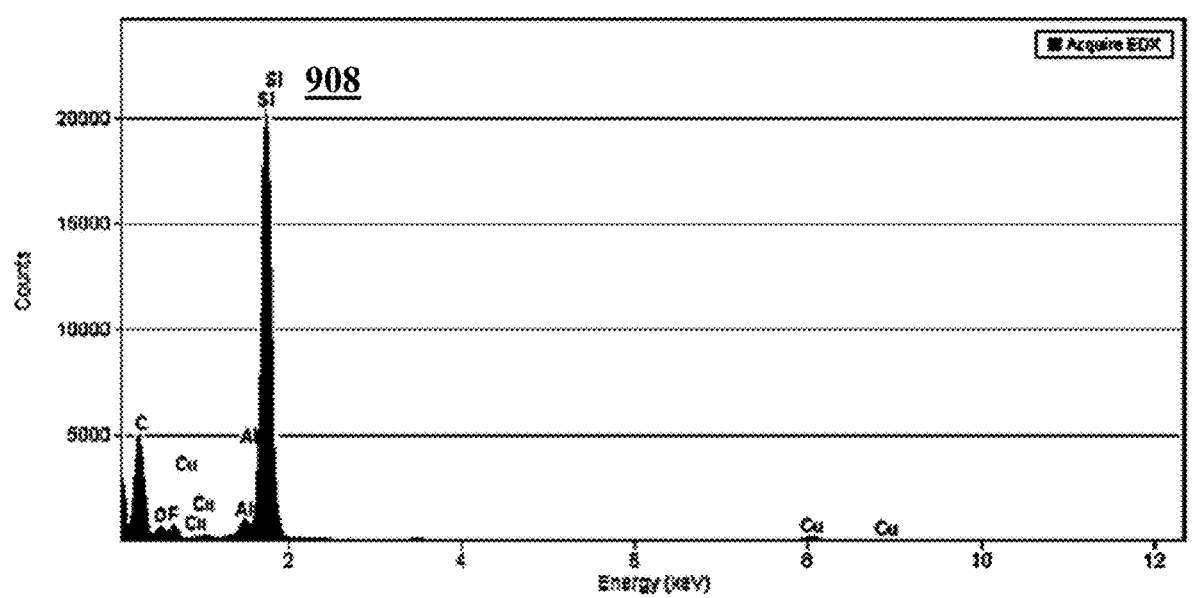
FIG. 9B shows energy-dispersive X-ray spectroscopy (EDS) spectrum of passivated SiNWs, consistent with one or more exemplary embodiments of the present disclosure.

Also, in order to determine the nature of the exemplary WiT nanostructure and the exemplary hollow nanotubes (NTs), the energy-dispersive X-ray spectroscopy (EDS) analysis was used in TEM mode. FIG. 9B shows EDS spectrum of a passivated SiNW prepared by 140 iterations during the passivation step, consistent with one or more exemplary embodiments of the present disclosure. Referring to FIG. 9B, Si peak 908 is predominant and confirms the fact that the core is silicon, while Al weak peak implies the formation of the passivation layer on the SiNWs.

Figure 9C:
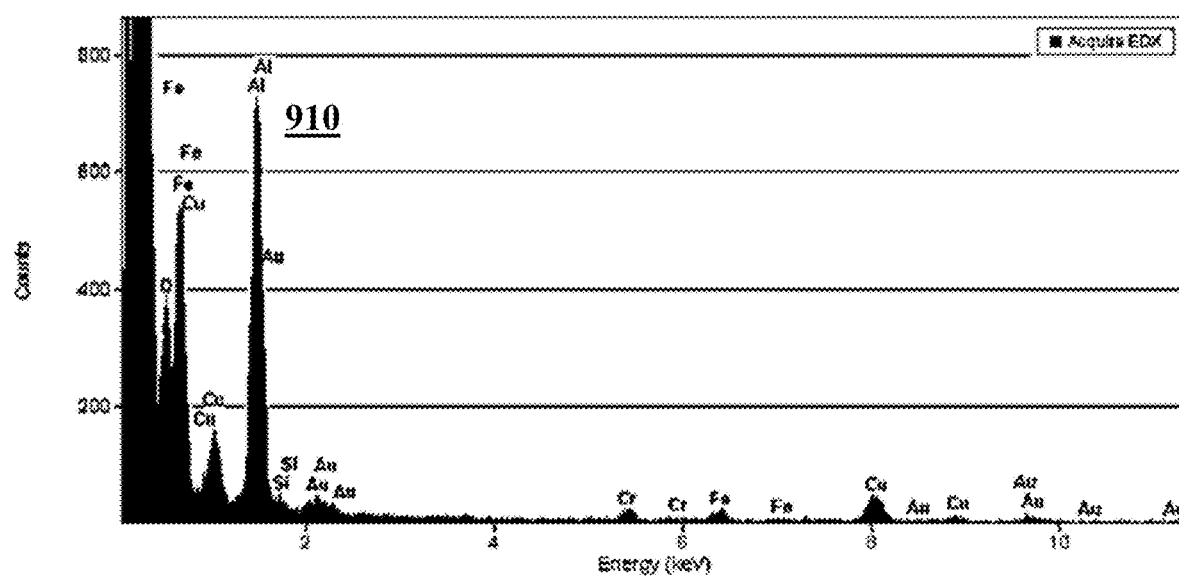
FIG. 9C shows an EDS spectrum of $Al_2O_3$ hollow nanotubes, consistent with one or more exemplary embodiments of the present disclosure.

FIG. 9C shows an EDS spectrum of $Al_2O_3$ hollow nanotubes, consistent with one or more exemplary embodiments of the present disclosure. Referring to FIG. 9C, the spectrum of the fully hollow NT clearly illustrates a sharp peak of Al 910 which indicates the aluminum and oxygen composition of the tube and complete removal of the Si core. The relatively strong oxygen peak suggests that the tube region is aluminum oxide.

Example 3: Lattice Structure of the Exemplary Wire-in-Tube Nanostrcture

Figure 10A:
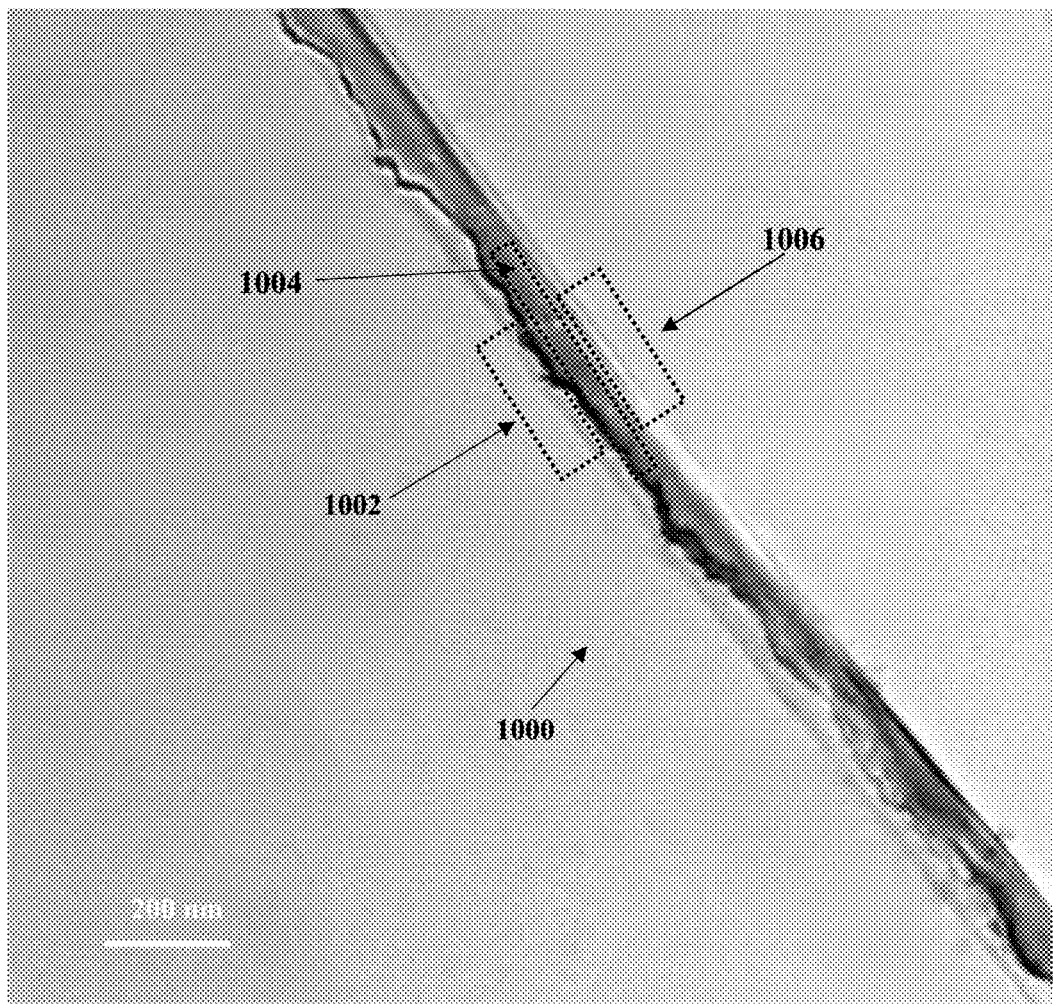
FIG. 10A shows a TEM image of a WiT nanostructure of Si-in-$Al_2O_3$, consistent with one or more exemplary embodiments of the present disclosure.

In this example, the lattice structure of the exemplary WiT nanostructures was examined using high-resolution transmission electron microscopy (HR-TEM) analysis. FIG. 10A shows a TEM image of WiT nanostructure 1000 of Si-in-$Al_2O_3$, consistent with one or more exemplary embodiments of the present disclosure. Referring to FIG. 10A, the WiT nanostructure 1000 has a diameter of about 120 nm and have three zones including an interface between an alumina NT shell and a SiNW core 1002, the SiNW core 1004, and an interface between the SiNW core and the alumina NT shell 1006.

Figure 10B:
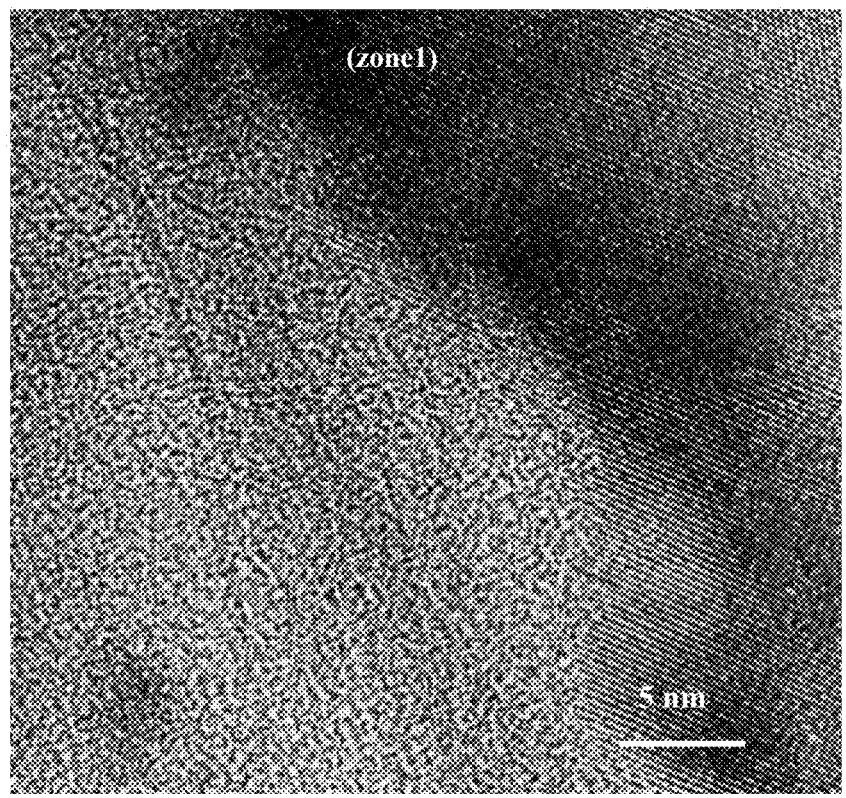
FIG. 10B shows an HR-TEM image of the interface between the alumina NT shell and the SiNW core, consistent with one or more exemplary embodiments of the present disclosure.
Figure 10C:
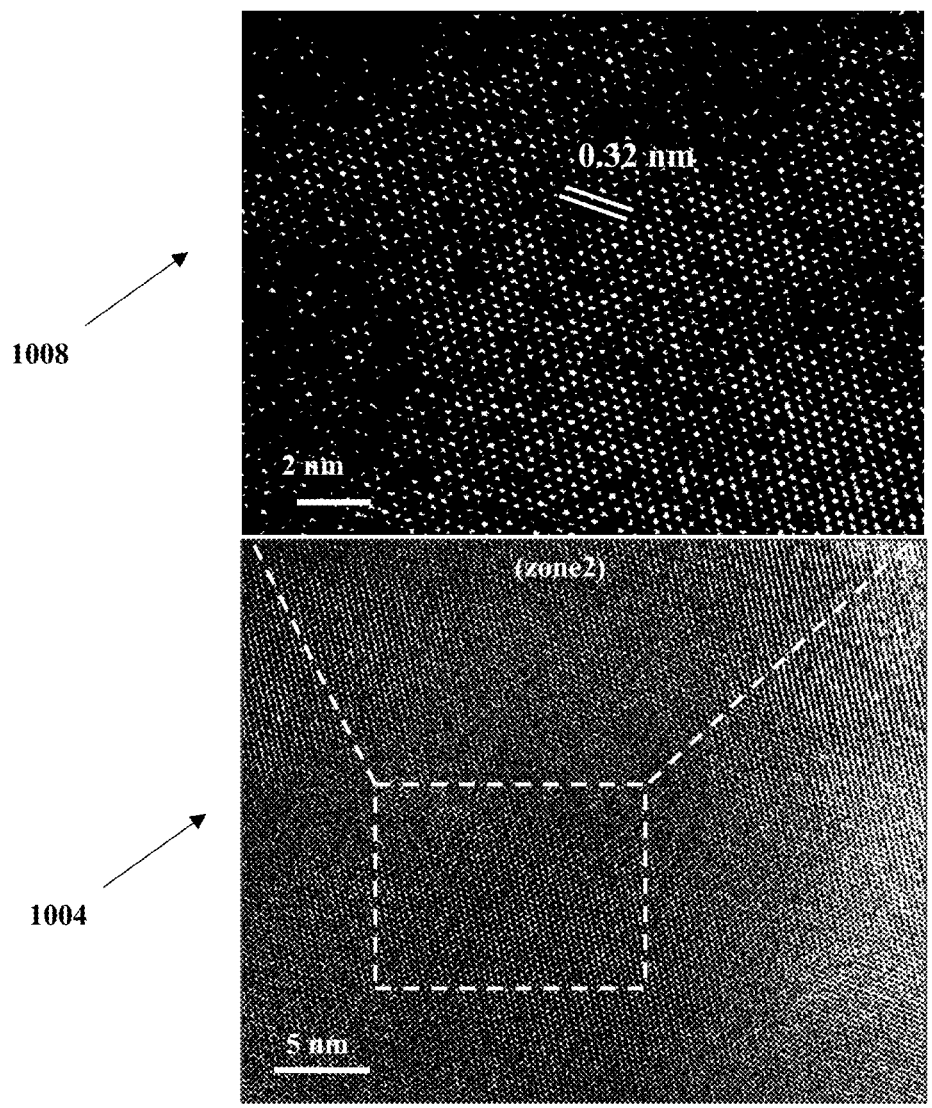
FIG. 10C shows an HR-TEM image of the SiNW core and its magnified view, consistent with one or more exemplary embodiments of the present disclosure.
Figure 10D:
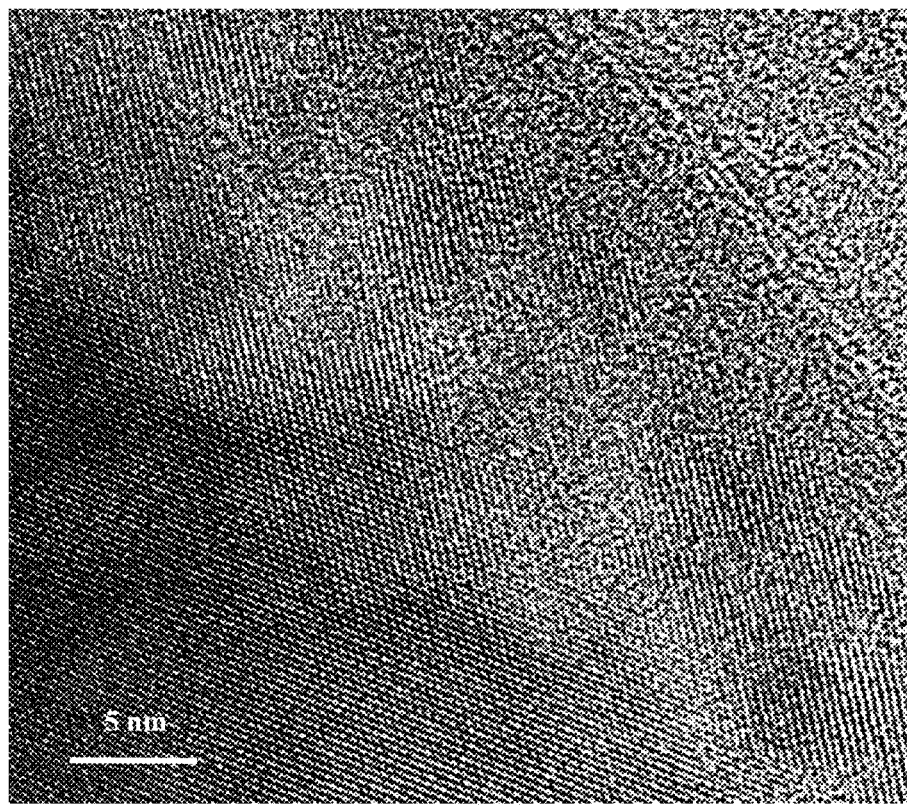
FIG. 10D shows an HR-TEM image of the interface between the SiNW core and the alumina NT shell, consistent with one or more exemplary embodiments of the present disclosure.

These three zones of WiT nanostructure 1000 have been studied with higher resolution imaging. FIG. 10B shows an HR-TEM image of the interface between the alumina NT shell and the SiNW core 1002, consistent with one or more exemplary embodiments of the present disclosure. FIG. 10C shows an HR-TEM image of the SiNW core 1004, and a magnified view 1008 of the HR-TEM of the SiNW core, consistent with one or more exemplary embodiments of the present disclosure. FIG. 10D shows an HR-TEM image of the interface between the SiNW core and the alumina NT shell 1006, consistent with one or more exemplary embodiments of the present disclosure.

Referring to FIGS. 10B-10D, HR-TEM images demonstrate the crystalline nature of the silicon core, which is sheathed with the amorphous $Al_2O_3$ shell. However, at the interfaces between amorphous alumina nanotube and crystalline core 1002 and 1004, it is observed that crystalline structure changes, which is believed to be due to bond formation between Al and Si, without bound to any theory. Referring to FIG. 10C, more analysis on the lattice image of Si core gives an interplanar spacing of 0.32 nm corresponding to Si (111) planes. Therefore, the SiNW core remains highly crystalline during the etching step, preserving the initial growth direction. Most of the large nanowires grow in (111) direction while $Al_2O_3$ shell has an amorphous structure.

Figure 11:
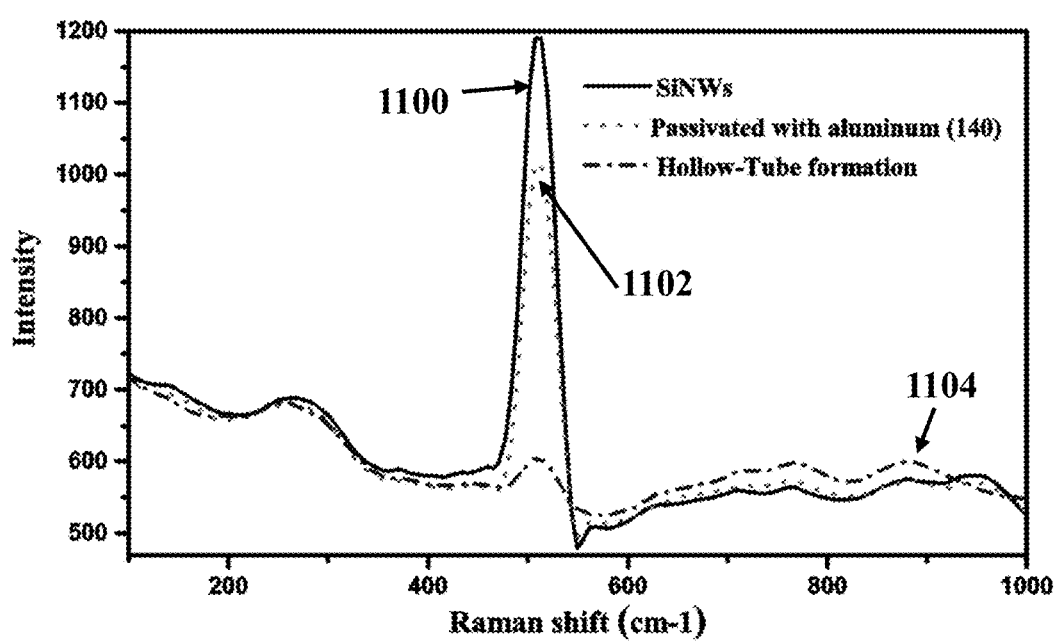
FIG. 11 shows a Raman spectra comparison of SiNWs as a template, SiNWs passivated, and $Al_2O_3$NTs, consistent with one or more exemplary embodiments of the present disclosure.

Example 4: Raman Spectroscopy, XPS, and XRD Characterization of the Exemplary Wire-in-Tube Nanostrcture In this example, Raman spectroscopy was used to investigate the formation of hollow nanotubes. Raman spectroscopy measurements were performed by a micro-Raman spectrometer with an excitation wavelength of about 532 nm. All measurements were carried out at room temperature in the ambient atmosphere. FIG. 11 shows Raman spectra of SiNWs as a template (1100), WiT nanostructures of SiNWs passivated during 140 iterations of the first and the second passivation steps for increasing thickness and porosity of the porous layer (1102), and $Al_2O_3$NTs processed under 25 seconds of etching time (1104), consistent with one or more exemplary embodiments of the present disclosure.

Referring to FIG. 11, the high-intensity peaks at 513 $cm^{-1}$ in 1100 and 1102 spectra may be attributed to the silicon content of the SiNW and the WiT nanostructure, and its intensity drops after the passivation and etching steps. Also, the formation of an alumina nanotube on nanowires may be assumed to be responsible for the reduction of the silicon peak at 513 $cm^{-1}$ in 1102 spectrum as compared to 1100 spectrum. Finally, with the complete extraction of Si core and formation of NTs, the silicon Raman line vanishes that confirms complete extraction of silicon. Therefore, the significant drop in the silicon intensity peak at 513 $cm^{-1}$ in 1104 spectrum as compared to 1100 spectrum may be due to the removal of the inner silicon content after the NT formation.

Figure 12:
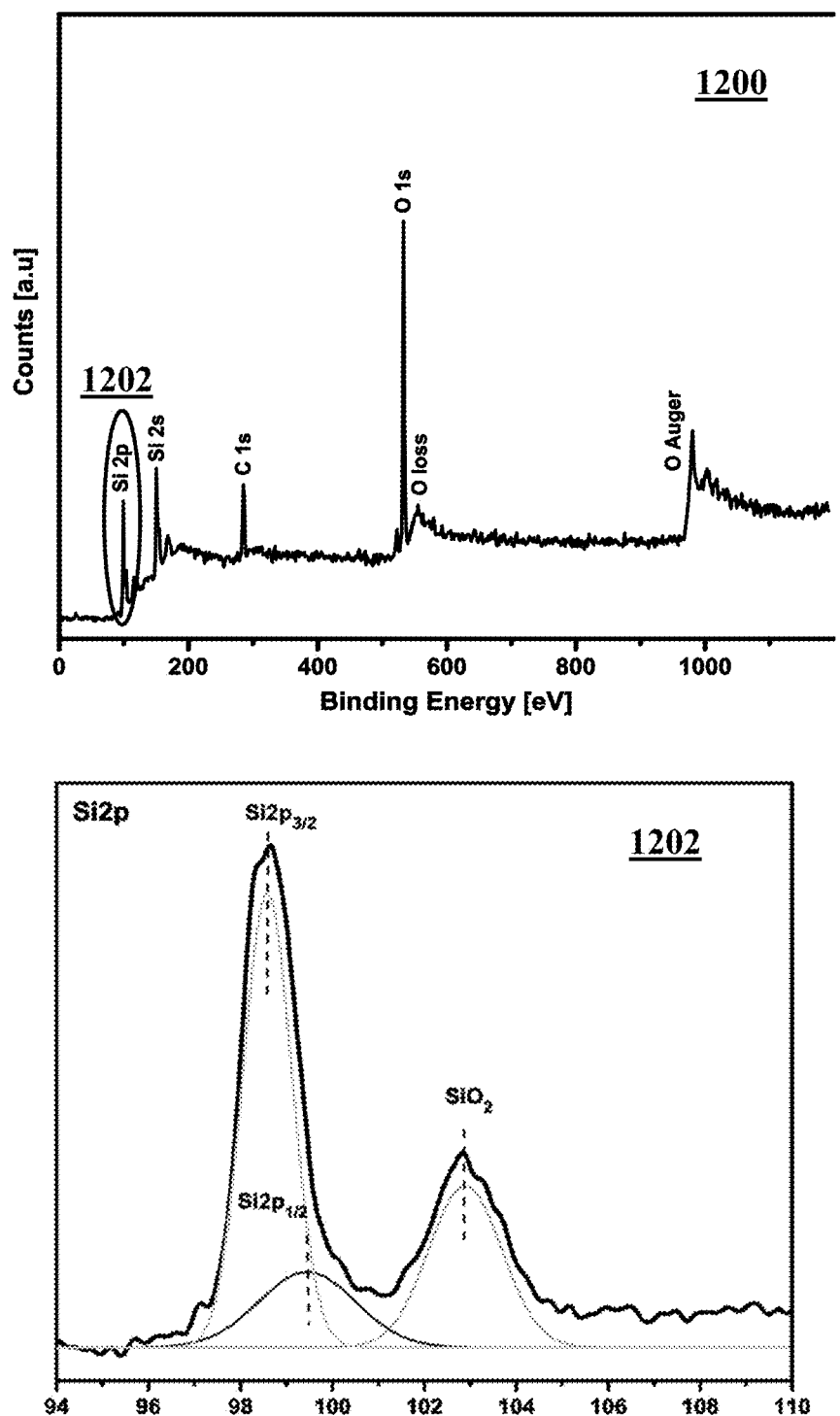
FIG. 12 shows low-resolution and high-resolution X-ray photoelectron spectroscopy (XPS) survey spectra of SiNWs as a template, consistent with one or more exemplary embodiments of the present disclosure.
Figure 13A:
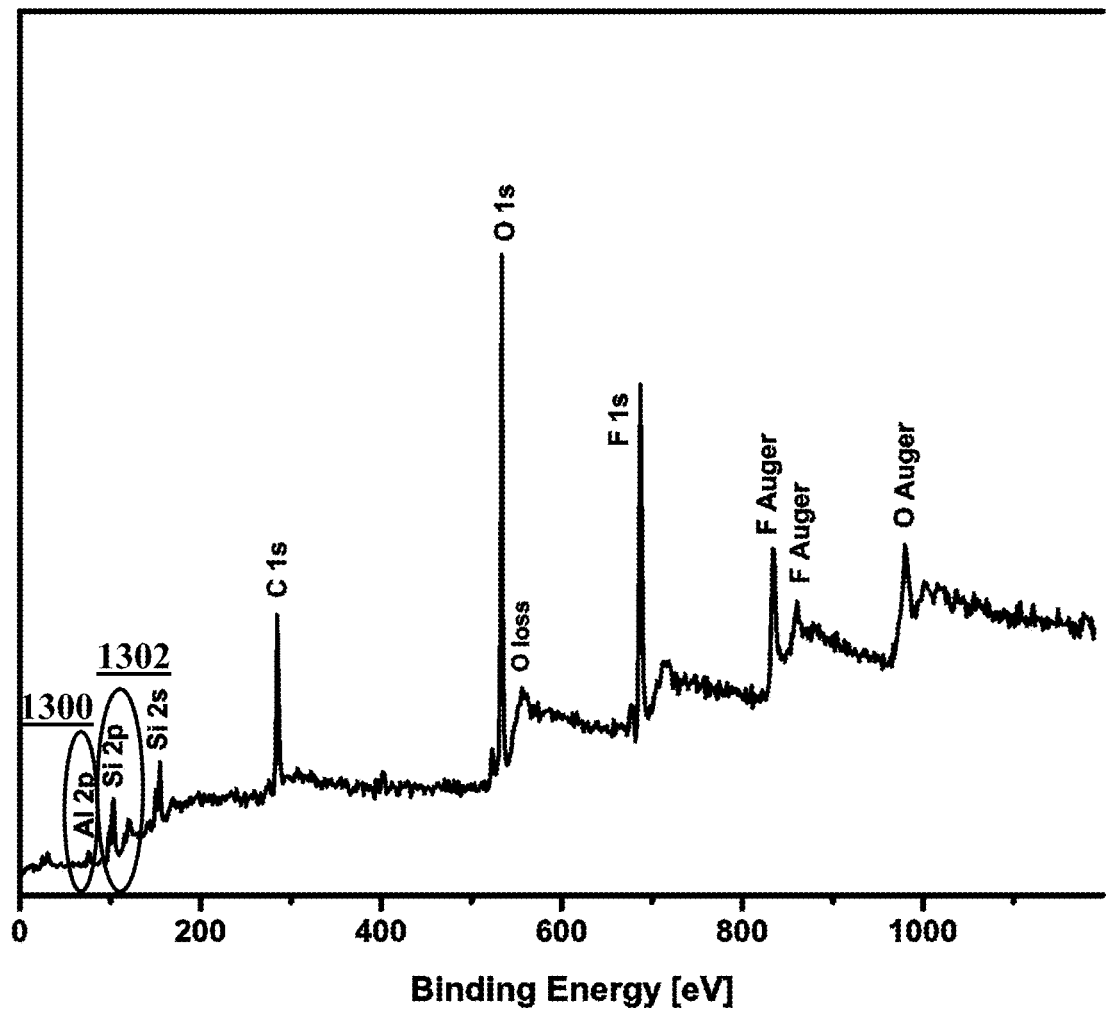
FIG. 13A shows low-resolution XPS survey spectra of SiNWs passivated during 140 iterations, consistent with one or more exemplary embodiments of the present disclosure.

Also, the chemical composition of the outer layers has been further investigated using an X-ray photoelectron spectroscopy (XPS) analysis. As an internal reference, the C 1 s peak set at 285 eV was used for determining absolute binding energies in XPS data. FIG. 12 shows low-resolution (1200) and high-resolution (1202) XPS spectra of SiNWs as a template, consistent with one or more exemplary embodiments of the present disclosure. FIG. 13A shows low-resolution XPS spectrum of WiT nanostructures SiNWs passivated during 140 iterations of the first and the second passivation steps for increasing thickness and porosity of the porous layer, consistent with one or more exemplary embodiments of the present disclosure.

Referring to FIGS. 12 and 13A, the low-resolution XPS spectrum shows that the passivation process induces significant changes in the sample compared to the reference SiNWs sample. The data obtained from these investigations corroborate the evolution of $Al_2O_3$ nanotubes just after the passivation steps. The peak maxima of the O 1 s, Si—$O_2$ and Si 2p core levels of SiNWs appear at 532.5, 103.3, and 98.2 eV energies, respectively. Also, Al peaks at 74.8 and 532.4 eV emerge for WiT nanostructures which have been passivated through 140 iterations and represent the binding energies of Al 2p and O 1 s, respectively. The higher oxidation state of Al in $Al_2O_3$ compared to metallic Al causes a shift in the binding energy of Al 2p to a higher value of 74.8 eV which indicates the complete oxidation of Al to $Al_2O_3$. The latter data are in agreement with the value expected for Al 2p in $Al_2O_3$.

Figure 13B:
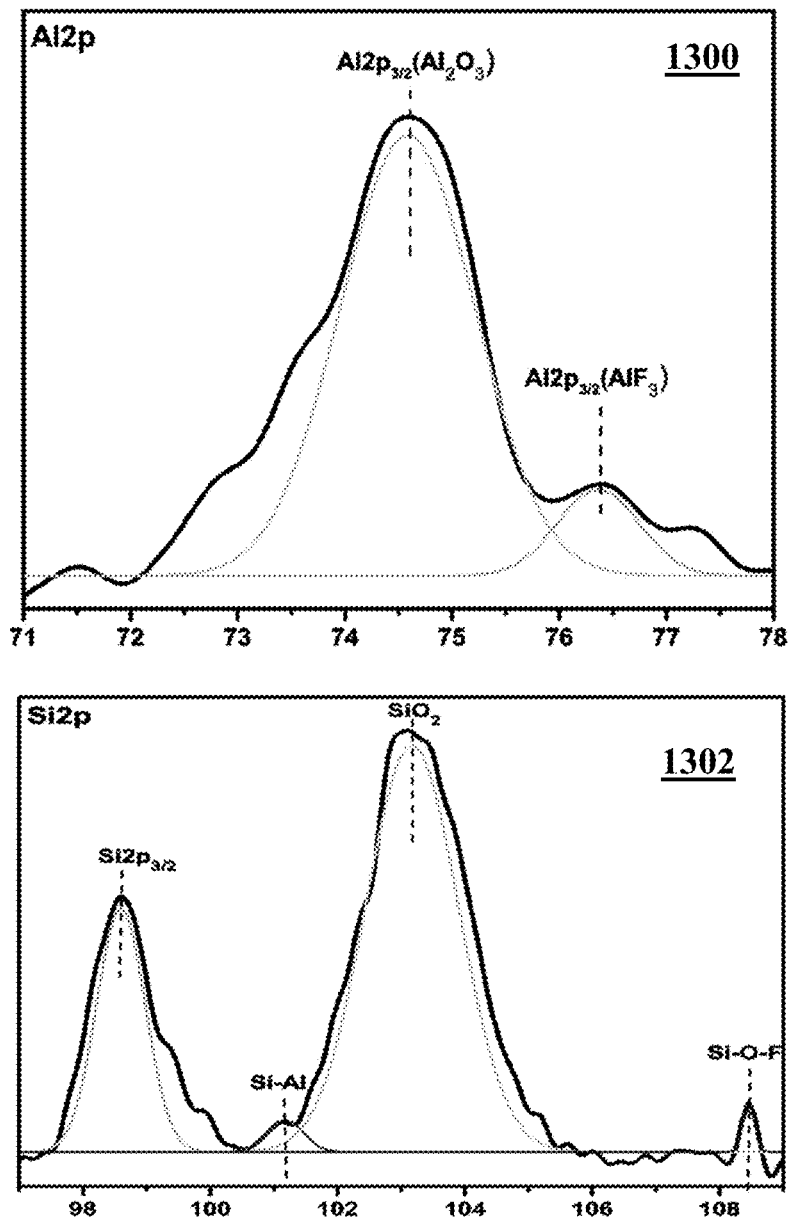
FIG. 13B shows high-resolution XPS survey spectra of SiNWs passivated during 140 iterations, consistent with one or more exemplary embodiments of the present disclosure.

FIG. 13B shows high-resolution XPS spectra of Al 2p (1300) and Si 2p (1302) regions for WiT nanostructure which are SiNWs passivated during 140 iterations, consistent with one or more exemplary embodiments of the present disclosure. Referring to FIG. 13B, the high-resolution XPS spectrum 1300 of the Al 2p region confirms the formation of Al—F bond located at 76.4 eV. Also, the high-resolution XPS spectrum 1302 of the Si 2p is decomposed into three contributing peaks emerging at around 101.2, at 103.1, and 108.4 eV. The peak at 101.2 eV corresponds to Al—Si bond, originating from the reaction of aluminum with the silicon core of the inner nanowire which is confirmed by the HR-TEM analysis. The peak at 108.4 eV may be ascribed to oxyfluorinated silicon passivation ($Si_xO_yF_z$). The intense signal around 687.2 eV corresponds to fluorine 1 s content.

Figure 14:
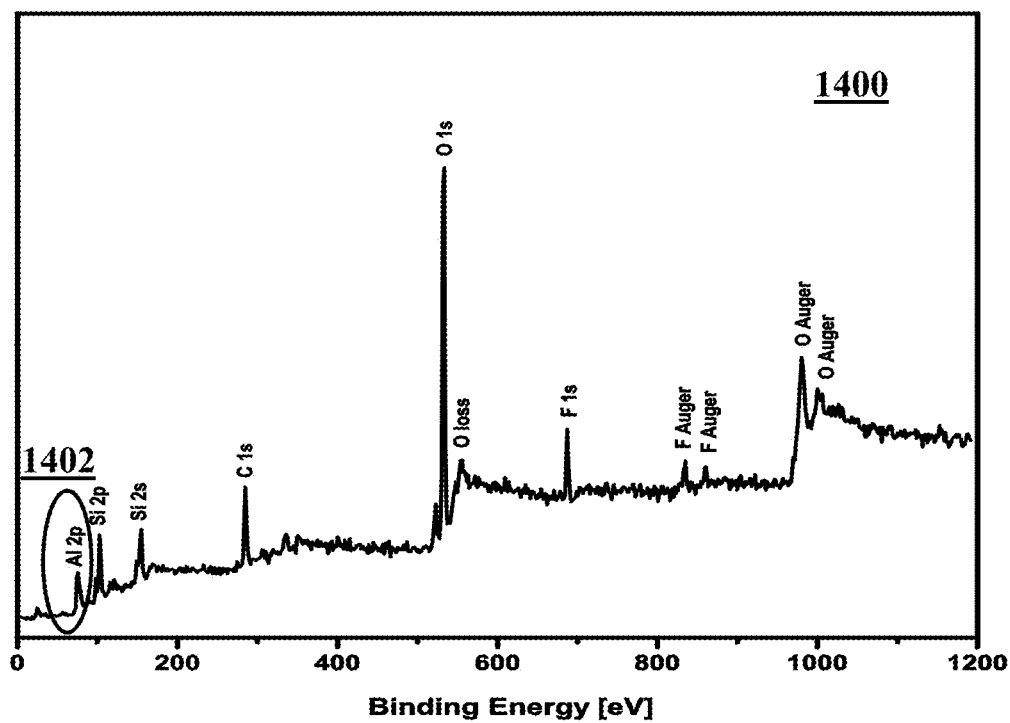
FIG. 14 shows low-resolution and high-resolution XPS survey spectra of $Al_2O_3$ hollow NTs processed under 25 s etching time, consistent with one or more exemplary embodiments of the present disclosure.
Figure 14:
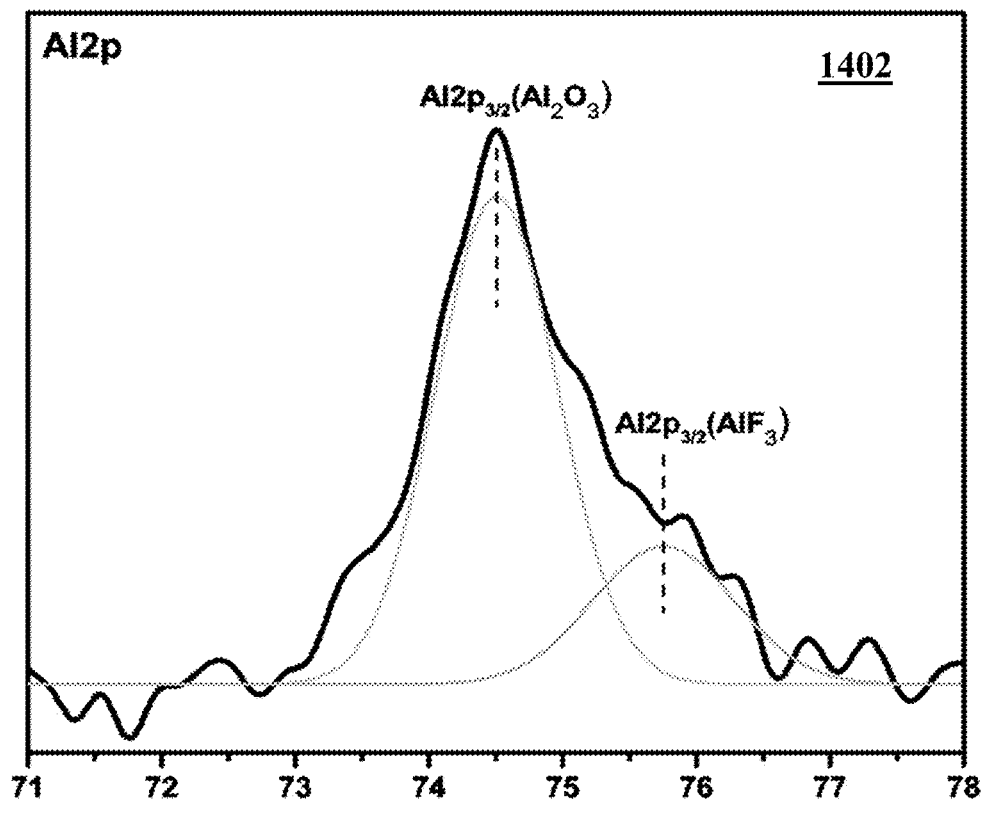

FIG. 14 shows low-resolution (1400) and high-resolution (1402) XPS spectra of $Al_2O_3$ hollow NTs obtained after 25 seconds of etching time, consistent with one or more exemplary embodiments of the present disclosure. Referring to FIG. 14, the presence of Al—O bonds in the NTs is confirmed by the binding energies of the Al 2p peak at 74.4 eV and the Al 2 s peak at 120.6 eV. The strongest peak, located at 532.5 eV, is attributed to O 1 s, which originates from Al-0 bonds. The trace values of oxygen during the etching step and the presence of the sample in an air ambient would result in complete oxidation of ultrathin layer of alumina nanotubes. These results corroborate the presence of Al bonds at alumina nanotubes and confirm the assumptions in Al deposition during the passivation steps.

Figure 15:
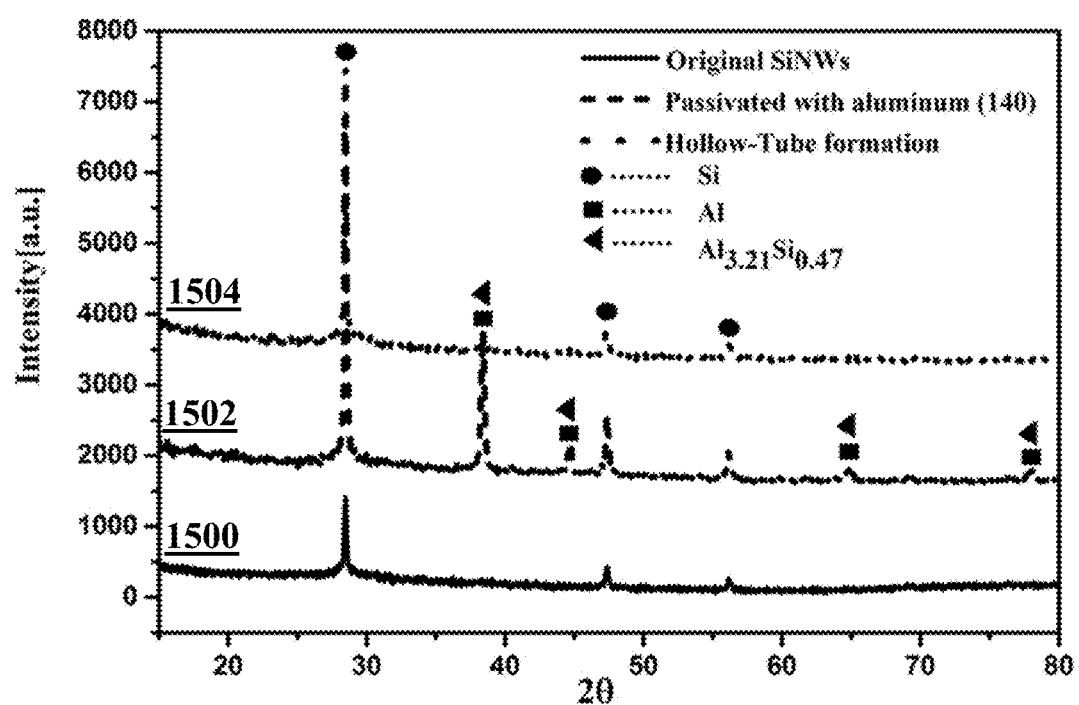
FIG. 15 shows X-ray diffraction (XRD) patterns of SiNWs, WiT nanostructures which are SiNWs passivated with Al during 140 iterations, and hollow Al nanotubes obtained after 25 seconds of etching time, consistent with one or more exemplary embodiments of the present disclosure.

In order to understand the structural evolution of SiNWs to hollow NTs, X-ray powder diffraction (XRD) analysis was used for further characterization of these structures at different stages of the tube formation. FIG. 15 shows X-ray diffraction (XRD) patterns of SiNWs 1500, WiT nanostructures which are SiNWs passivated with Al during 140 iterations 1502, and hollow Al nanotubes 1504 obtained after 25 seconds of etching time, consistent with one or more exemplary embodiments of the present disclosure.

Referring to FIG. 15, spectrum 1500 of SiNWs shows the presence of strong peaks at 28.4°, 47.3°, and 56.4°, which belong to silicon crystalline planes of (111), (220), and (311). In spectrum 1502 for WiT nanostructures, peaks at 38.3°, 44.6°, 65°, and 78° appear which correspond to Al which occurs as a result of new phase formation between Al and Si. The results of XRD analysis seem to be consistent with the data obtained from HR-TEM and XPS investigations. After the etching step has been carried out, the inner silicon and any possible aluminum-silicon constituents were removed and the hollow perforated NTs were obtained. Also, spectrum 1504 confirms disappearing of the aluminum peaks in hollow NTs. The main silicon peak is due to the remaining parts of the silicon wires and the silicon substrate.

Example 5: Application of the Exemplary Wire-in-Tube Nano Structure in Lithium-Ion Batteries The exemplary WiT nanostructures may be grown directly on stainless steel substrates making them suitable as the binder-free anode material for lithium-ion batteries (LIBs). The exemplary WiT nanostructures may effectively alleviate the structural strain and tolerate the numerous volume changes of Si wires due to the existence of hollow space in the structure of WiT nanostructures. Without bound by any theories, it may be believed that the free outward expansion may be possible for Si wires because of the fact that the outer shell of alumina is mechanically rigid and hence significantly reduces the electrode pulverization. Moreover, the porous nanostructure of WiT sidewalls may provide more accessible sites to the electrolyte.

Figure 16A:
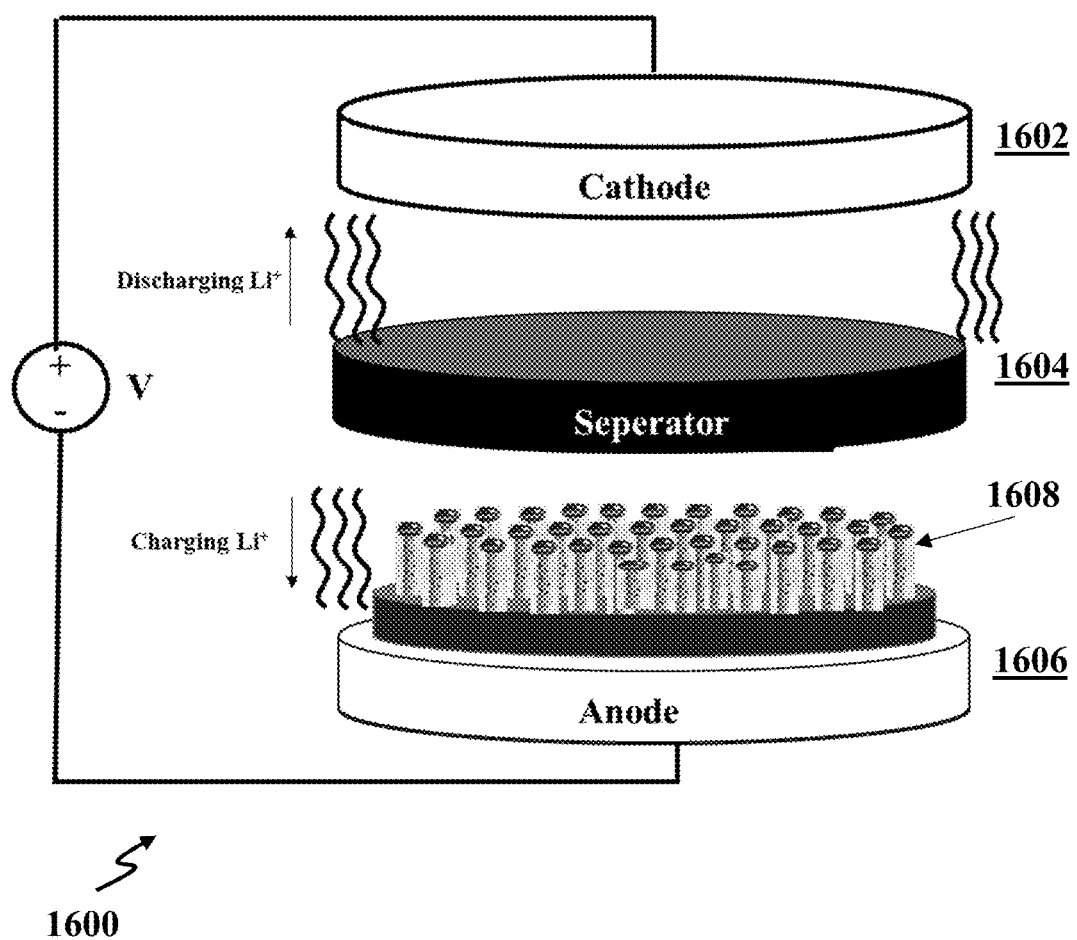
FIG. 16A shows a microscopic half-cell diagram of an exemplary lithium-based ion battery (LIB) including exemplary wire-in-tube nanostructures, consistent with one or more exemplary embodiments of the present disclosure.

FIG. 16A shows a microscopic half-cell diagram of an exemplary lithium-based ion battery (LIB) 1600 including exemplary wire-in-tube nanostructures 1608, consistent with one or more exemplary embodiments of the present disclosure. Referring to FIG. 16A, the exemplary LIB 1600 included a cathode 1602, a separator 1604, and an exemplary anode 1606. Exemplary anode 1606 may include a plurality of wire-in-tube nanostructures 1608.

In exemplary LIB 1600 lithium metal may be used as the counter and reference electrodes and a 1M $LiPF_6$ solution in a 1:1 (vol %) mixture of ethylene carbonate (EC) and dimethyl carbonate (DMC) may be used as an electrolyte. Exemplary LIB 1600 is a rechargeable battery in which a lithiation/delithiation process is a key electrochemical process for their functionality. During lithiation (discharging), the $Li^+$ ions flow from exemplary anode 1606 to cathode 1602 through an electrolyte and separator 1604, while the direction of the $Li^+$ ions reverses and $Li^+$ ions flow from cathode 1602 to exemplary anode 1606 during delithiation (charging) when an overvoltage is applied.

Figure 16B:
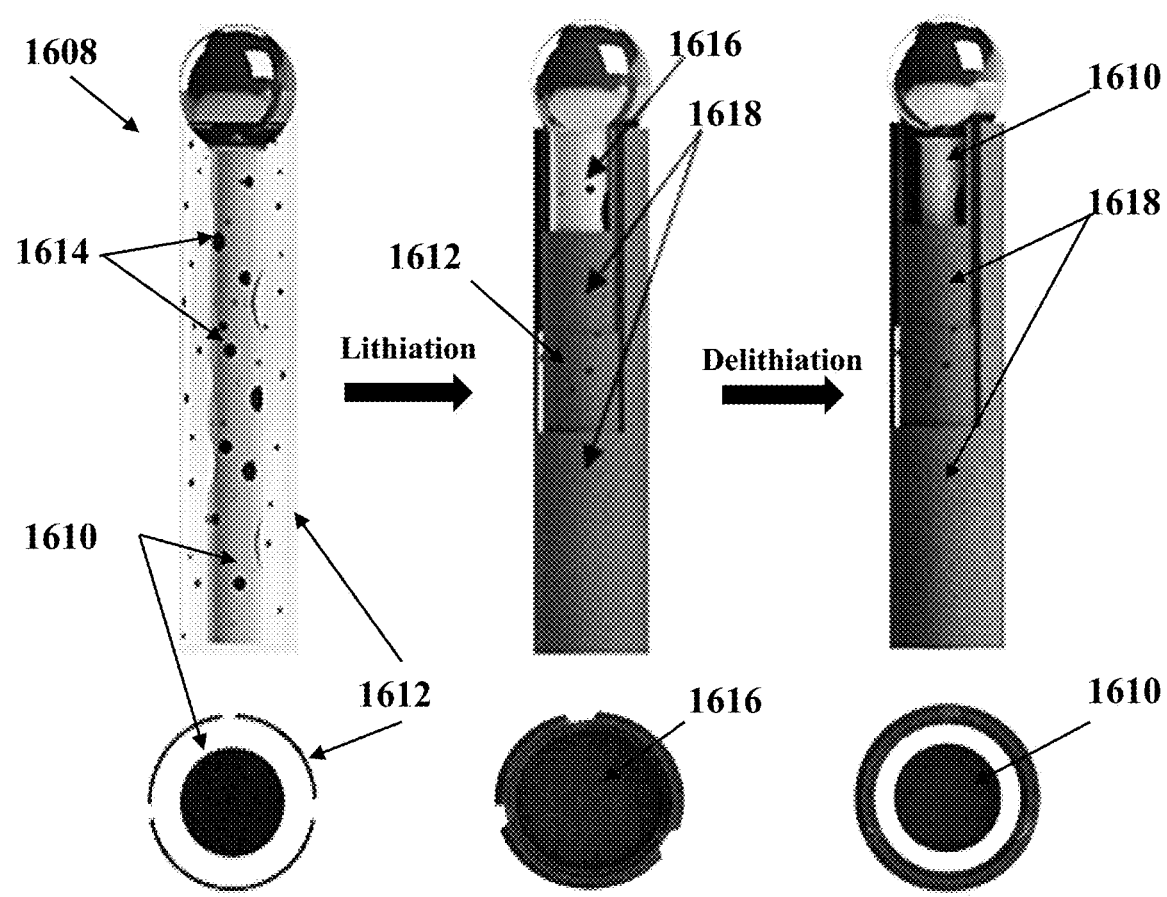
FIG. 16B shows a schematic representation of a cross-sectional view and a top view of exemplary WiT nanostructure for SEI formation during lithiation/delithiation process, consistent with one or more exemplary embodiments of the present disclosure.

During lithiation/delithiation process of the first cycle, a passivation layer called solid electrolyte interphase (SEI) is formed on surfaces of exemplary anode 1606 from decomposition of electrolytes. The SEI plays a critical role in the performance of LIBs. The SEI allows $Li^+$ transport and blocks electrons in order to prevent further electrolyte decomposition and ensure continued electrochemical reactions. FIG. 16B shows a schematic representation of a cross-sectional view and a top view of exemplary WiT nanostructure 1608 for SEI formation during lithiation/delithiation process, consistent with one or more exemplary embodiments of the present disclosure.

Referring to FIG. 16B, numerous nanosized pores 1614 exist in the porous alumina nanotube 1612 which allow liquid electrolyte to flow inside the hollow structure of exemplary WiT nanostructure 1608 and inundate the SiNW 1610. This seems contradictory because it might violate the whole concept of having a stable SEI layer by isolating SiNW 1610 from the liquid electrolyte. However, during lithiation step of first cycle, solid-electrolyte interphase (SEI) layers 1618 forms on the surfaces of SiNW 1610 and porous alumina nanotube 1612. Then, SiNW 1610 expands due to lithiation and the expanded SiNW 1616 and the SEI layer 1618 on its surface touch the inner surface of porous alumina nanotube 1612. Upon the delithiation step of first cycle, expanded SiNW 1616 shrinks to SiNW 1610 and the SEI layers 1618 remains at the inner and outer surfaces of porous alumina nanotube 1612 and isolates SiNW 1610 from the liquid electrolyte and only let $Li^+$ ions pass through.

After multiple cycles of lithiation/delithiation, the SEI layers 1618 may be fully sealed and almost no side reaction occurs between SiNW 1620 and the liquid electrolyte. It should be considered that the thickness of porous alumina nanotube 1612 may be critical because it significantly impacts the charge transfer rates. The porous alumina nanotube 1612 may be thick enough for providing the mechanical and chemical stability of the architecture, but, thin enough for decreasing the ionic resistance. Therefore, porous alumina nanotube 1612 shields the SEI from unwanted side reactions in addition to contributing to capacity and helps the structure to expand freely without damaging the porous alumina nanotube 1612.

Example 6: Electrochemical Properties of the Exemplary Wire-in-Tube Structure

Figure 17:
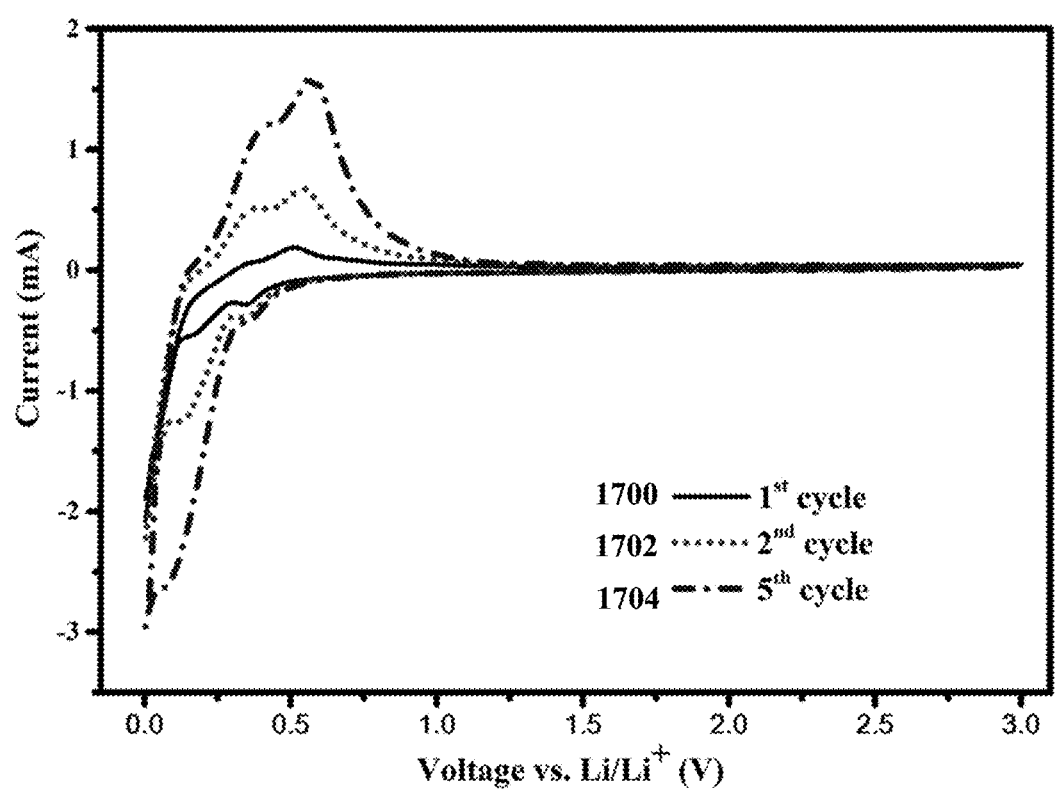
FIG. 17 shows voltammogram (CV) curves of first, second, and $5^{th}$ cycles at a scan rate of about 1 mV s$^{-1}$, consistent with one or more exemplary embodiments of the present disclosure.

In this example, electrochemical properties of the exemplary WiT nanostructure was investigated using this structure as an anode of a lithium-ion battery (LIB) in different cycles of charging/discharging. FIG. 17 shows voltammogram (CV) curves of the first cycle 1700, second cycle 1702, and $5^{th}$ cycle 1704 at a scan rate of about 1 mV s$^{-1}$, consistent with one or more exemplary embodiments of the present disclosure. Referring to FIG. 17, the characteristic peaks of Si are not discernible in the first cycle curve 1700 indicating that $Al_2O_3$ coating as a protective layer prevents electrolyte decomposition and significantly reduce the formation of the SEI layer. In the curves of later cycles 1702 and 1704, the magnitude of almost all current peaks increases and the corresponding CV curves show two small and broad cathodic peaks at around 0.1 and 0.3 V. These peaks are attributed to the formation of amorphous LixSi phase and the solid-electrolyte interphase (SEI) layer, respectively.

Referring again to FIG. 17, a sharper cathodic peak is observed at a voltage of about 0.01 V which gradually increases during multiple cycles of lithiation/delithiation process. This peak may be attributed to crystalline $Li_{15}Si_4$. In addition, there are two main peaks in the anodic branch of CV curves at around 0.35 and 0.55 V, which are characteristic peaks for amorphous Si, related to different delithiation degrees of c-$Li_{15}Si_4$ to a-Lix' Si and a-Lix' Si to a-Si. In the following cycles of CV curves of the exemplary WiT nanostructure, the peak intensities increased, which may be related to the fact that the porous alumina nanotube became ionically conductive that effectively conducts lithium ions and blocks electrons. However, the intensity of CV peaks at the uncoated SiNWs may be decreased at the second cycle which is an indication of instability of uncoated SiNW electrode.

Figure 18:
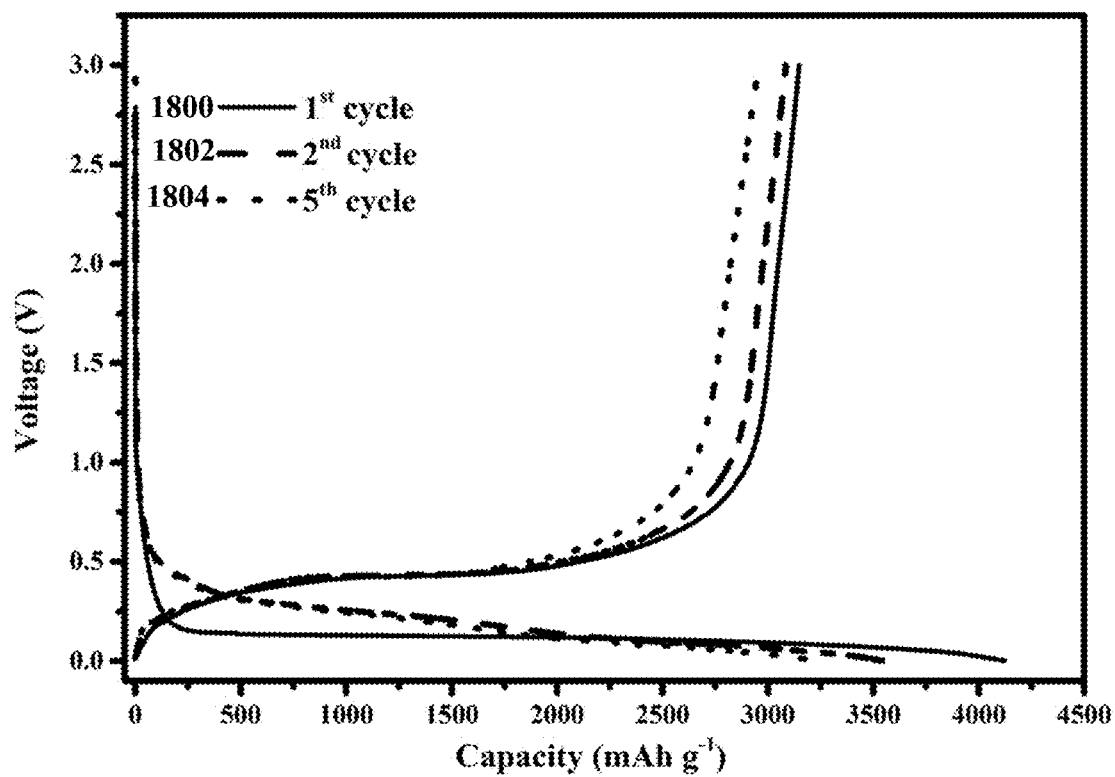
FIG. 18 shows galvanostatic charge/discharge voltage profiles of an exemplary WiT nanostructure for $1^{st}$, $2^{nd}$, and $5^{th}$ cycles at a rate of C/16, consistent with one or more exemplary embodiments of the present disclosure.

Also, the galvanostatic performances of exemplary WiT nanostructures were examined by employing charge/discharge tests with a potential window of 0.002 to 3 V at various rate densities. FIG. 18 shows galvanostatic charge/discharge voltage profiles of an exemplary WiT nanostructure between 0.002 and 3.00 V vs Li/Li$^+$ for $1^{st}$ cycle 1800, $2^{nd}$ cycle 1802, and 5th cycle 1804 at a rate of C/16, consistent with one or more exemplary embodiments of the present disclosure. Referring to FIG. 18, galvanostatic charge/discharge voltage profiles indicate high initial discharge and charge capacities of 4125 mAh g$^{-1}$ and 3148 mAh g$^{-1}$ which are close to the theoretical values and yielding a coulombic efficiency (CE) of about 76%.

Figure 19A:
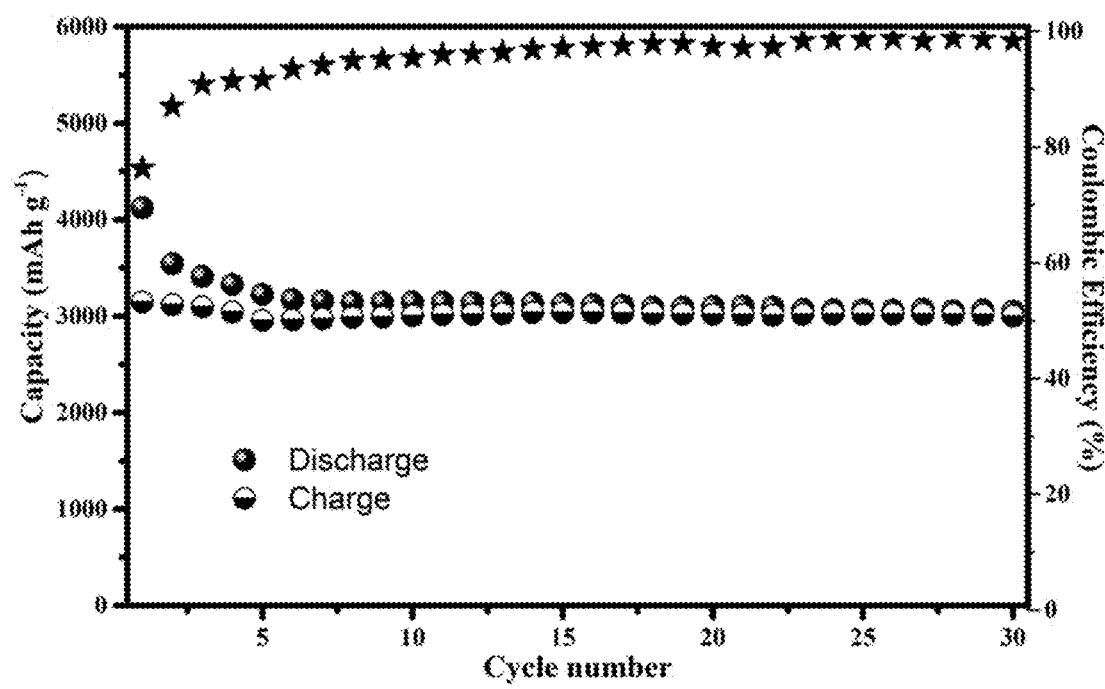
FIG. 19A shows cycling stability and coulombic efficiency of an exemplary WiT nanostructure at a C/16 rate density for 30 cycles, consistent with one or more exemplary embodiments of the present disclosure.

FIG. 19A shows cycling stability and coulombic efficiency of an exemplary WiT nanostructure at a C/16 rate density for 30 cycles, consistent with one or more exemplary embodiments of the present disclosure. Referring to FIG. 19A, after 30 cycles, the capacity of exemplary WiT nanostructure kept almost steady; so that the charge capacity reached 3002 mAh g$^{-1}$ with retention of about 95.4%. The irreversible capacity in the initial cycle may be attributed to the irreversible alloying with Li, trapped Li$^+$ ions in the inner holes or defects of Si, and the SEI formation. Also, the coulombic efficiency may be further improved in practical applications by pre-lithiation process of Si-containing anode using solution or electrochemical processes.

The enhanced porosity of Si part of the nanostructures may be responsible for a high capacity of exemplary WiT nanostructures. These pores may act as the active sites for lithium diffusion and enhance the effective surface area of the Si nanostructures. In addition, the porous alumina nanotube may prevent the degradation of SEI layer at a Si/electrolyte interface. Also, the existence of empty spaces around each Si wire in WiT nanostructures allows facile expansion during lithiation step and prevents subsequent damages to the alumina nanotube because of Si volume changes. The voltage difference between the charge and discharge plateaus ($\Delta V$) is about 0.3-0.4 V which is comparable to similar reports. The voltage difference correlated to the polarization of the half-cell system (the smaller the $\Delta V$, the lower the polarization). Further improvements of the polarization may be obtained by including additives to electrolyte and electrodes to increase coulombic efficiency and capacity retention by decreasing the polarization.

Figure 19B:
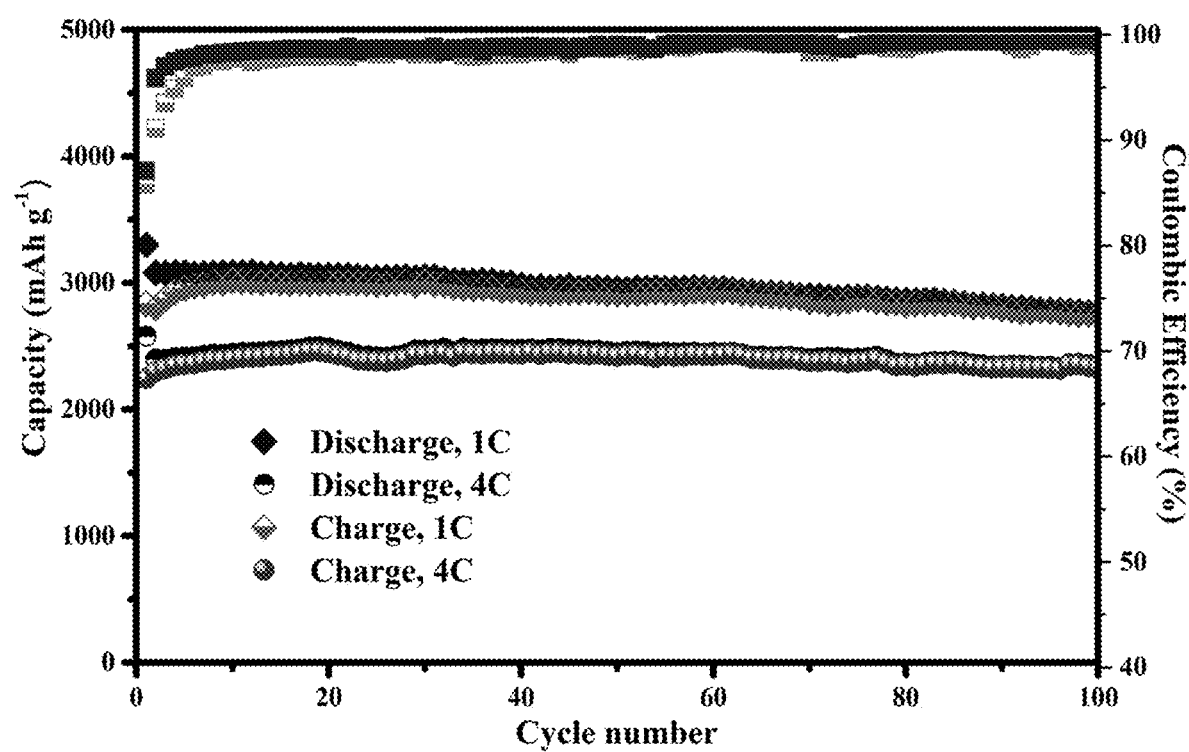
FIG. 19B shows cycling stability and coulombic efficiency of an exemplary WiT nanostructure at 1C and 4C rate densities for 100 cycles, consistent with one or more exemplary embodiments of the present disclosure.

FIG. 19B shows cycling stability and coulombic efficiency of an exemplary WiT nanostructure at 1C and 4C rate densities for 100 cycles, consistent with one or more exemplary embodiments of the present disclosure. Referring to FIG. 19B, it is observed that the initial charge capacity of WiT nanostructures is 2832 mAh g$^{-1}$ at a rate density of 1 C which exhibits an excellent coulombic efficiency of about 86%. The capacity is reduced to 2739 mAh g$^{-1}$ after 100 cycles, indicating 96.7% capacity retention. When the rate density is increased to 4 C, the WiT nanostructures may still deliver a discharge/charge capacity of as high as 2578.4/2245.6 mAh g$^{-1}$, respectively. This high rate capacity gradually increases to above 2329 mAh g$^{-1}$ over the first 100 cycles. The charge capacity enhancement probably may be ascribed to the high porosity of WiT nanostructures.

Referring again to FIG. 19B, in the first few cycles of a high rate charge/discharge test, Li ions are not able to diffuse into the active sites of WiTs structure and the effective surface area of the electrode is reduced. Also, the coulombic efficiency increased to about 97% after the three cycles, which is higher than low rate cycling performance. This is probably due to the smaller volume expansion of WiTs nanostructure and more stable SEI layer under the high charge/discharge rate. Therefore, the exemplary WiT nanostructures show=high charge capacity of 2329 mAh g$^{-1}$ at a rate density of 4 C after 100 cycles.

Figure 20:
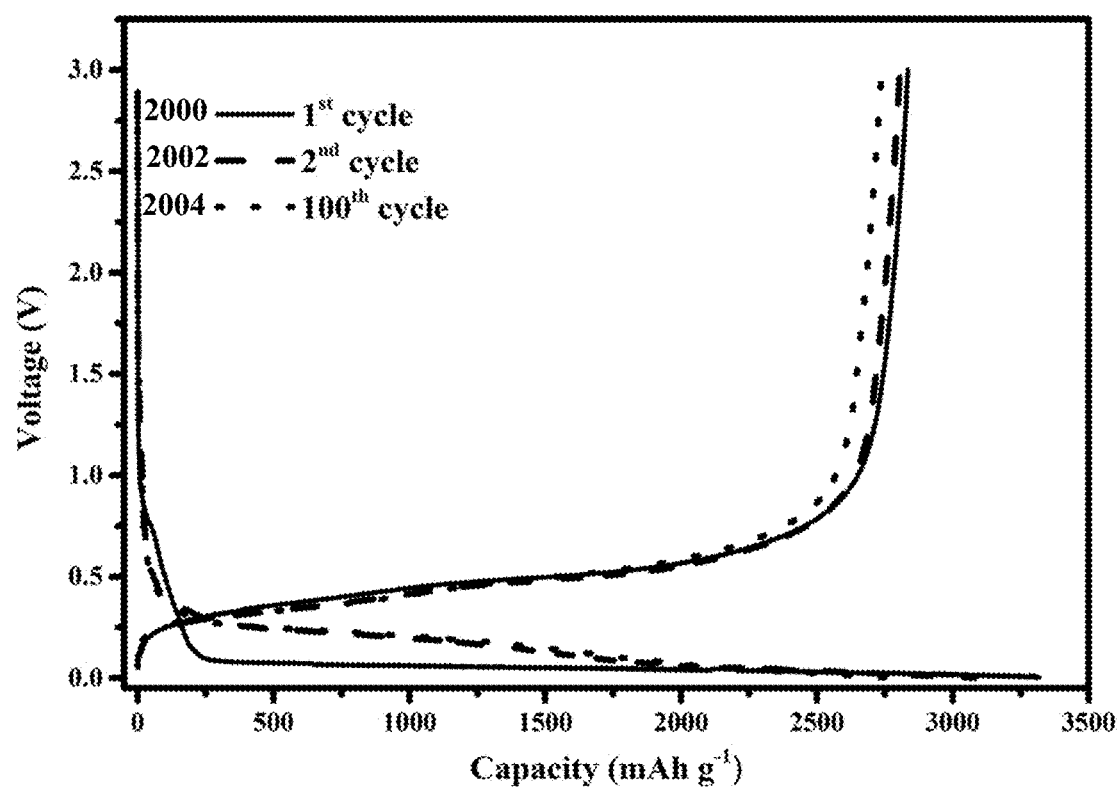
FIG. 20 shows galvanostatic charge/discharge voltage profiles of an exemplary WiT nanostructure for $1^{st}$, $2^{nd}$, and $100^{th}$ cycles at a rate of 1C, consistent with one or more exemplary embodiments of the present disclosure.

FIG. 20 shows galvanostatic charge/discharge voltage profiles of an exemplary WiT nanostructure for $1^{st}$ cycle 2000, $2^{nd}$ cycle 2002, and 100th cycle 2004 at a rate of 1C, consistent with one or more exemplary embodiments of the present disclosure. Referring to FIG. 20, the shape of the voltage profile may not undergo a considerable change from the $2^{nd}$ cycle 2002 to the 100th cycle 2004, indicating the highly stable performance of exemplary WiT nanostructure.

Figure 21:
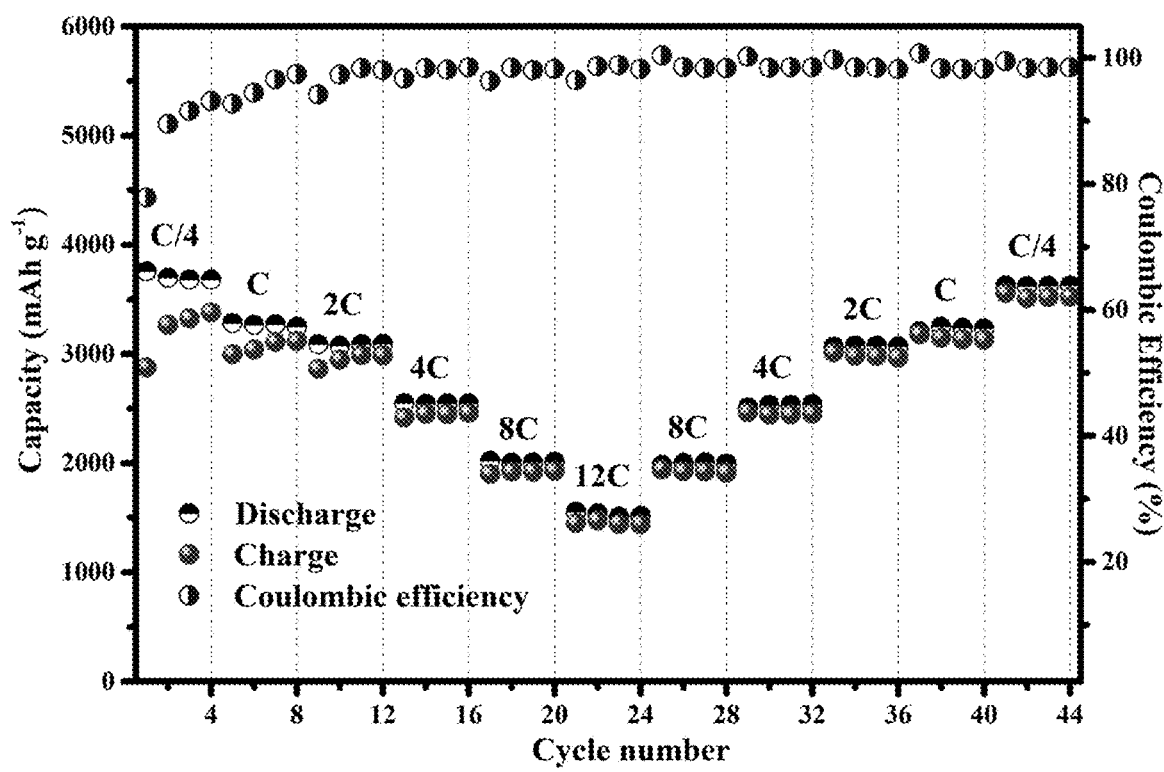
FIG. 21 shows a rate capability test under a variable current rate of C/4 to 12C with 4 cycles at each C-rate and a first cycle at C/4, consistent with one or more exemplary embodiments of the present disclosure.

FIG. 21 shows a rate capability test under a variable current rate of C/4 to 12C with 4 cycles at each C-rate and a first cycle at C/4, consistent with one or more exemplary embodiments of the present disclosure. Referring to FIG. 21, after an initial discharge capacity of 3756 mAh g$^{-1}$ at C/4, the capacity may be found to stabilize at 3681 mAh g$^{-1}$. Furthermore, cycling at C, 2 C, and 4 C delivers high reversible capacities of 3282, 3089, and 2548, respectively. Then, the exemplary WiT nanostructure may operate at rates as high as 8 C and 12 C while still shows a great capacity of 2021 and 1553 mAh g$^{-1}$ which demonstrate the excellent high rate capability of the exemplary WiT nanostructures.

Referring again to FIG. 21, when the C rate is returned step by step from 12 C to C/4 again, the original capacity is largely recovered in each level, revealing the robustness and stability of the exemplary WiT nanostructures. Therefore, the stable SEI along with the high porosity and the hollow nature of the WiTs nanostructure allows outstanding high power capability. Without bound by any theory, it is believed that the difference in shape and hollowness of the exemplary WiT nanostructures may have an effect on their electrochemical properties.

Figure 22:
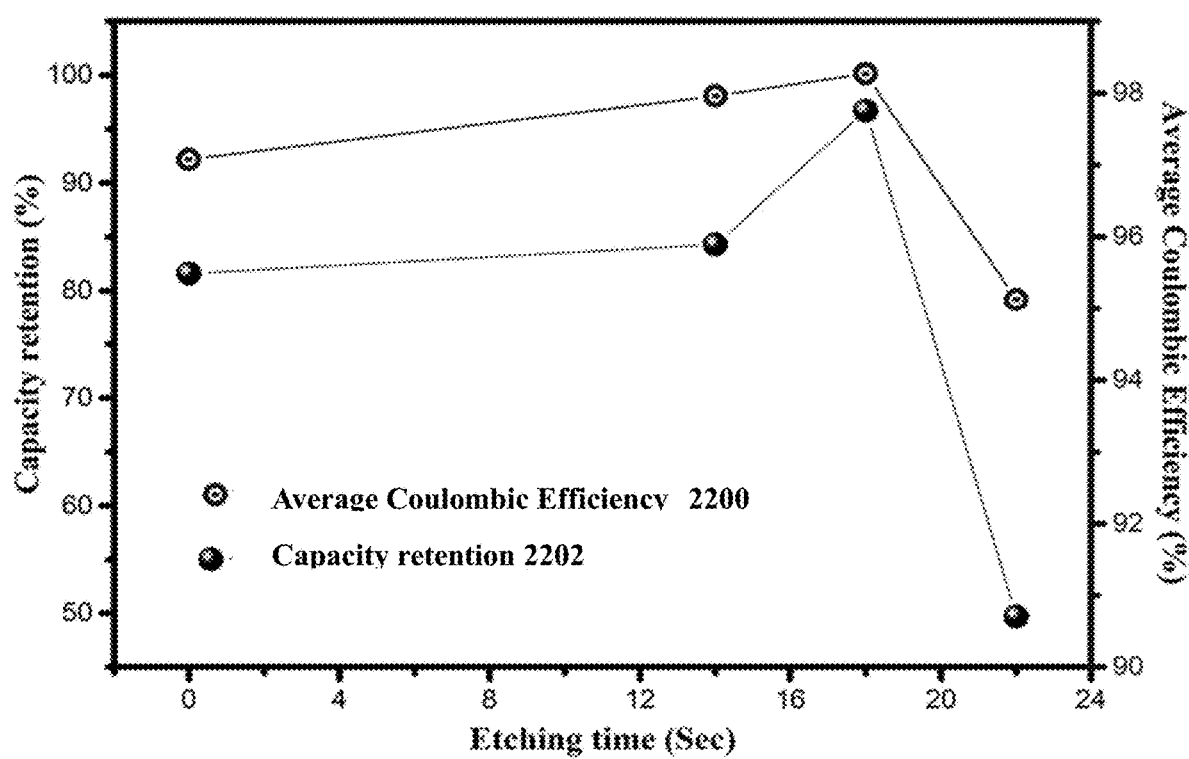
FIG. 22 shows a comparison between average coulombic efficiency and capacity retention of exemplary WiT nanostructures for 100 cycles with different etching times, consistent with one or more exemplary embodiments of the present disclosure.

FIG. 22 shows a comparison between average coulombic efficiency 2200 and capacity retention 2202 of exemplary WiT nanostructures for 100 cycles with different etching times, consistent with one or more exemplary embodiments of the present disclosure. Referring to FIG. 22, exemplary WiT nanostructures with an etching time of about 18 seconds show the highest capacity retention among other etching times based on capacity retention 2202 graph. This high capacity retention may be attributed to larger hollow space in the exemplary WiT nanostructures with 18 seconds of etching time. As the etching time increases, more volume is available to accommodate large expansion of SiNW during cycling. However, more etching of SiNW results in weakening of the whole WiT nanostructure leading to loss of electrical contact between Si and substrate after a few cycles and the severe capacity degradation.

Referring again to FIG. 22, the best performance regarding average coulombic efficiency was achieved for the WiT nanostructure with 18 seconds of etching time. This improvement in average coulombic efficiency may be caused by more stable SEI layer in exemplary WiT nanostructures with 18 seconds of etching time due to the less generation of cracks within the multiple cycles of lithiation/delithiation process. Besides, the average coulombic efficiencies may be further enhanced by increasing the cycle numbers, pre-lithiation, surface treatments of nanostructures and electrolyte modifications. Therefore, high specific capacity, coulombic efficiency, and remarkable capacity retention may be obtained under the combined action of the one-dimensional SiNW in porous alumina nanotube architecture and optimized hollow spaces of the exemplary WiT nanostructure.

While the foregoing has described what may be considered to be the best mode and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

The scope of protection is limited solely by the claims that now follow. That scope is intended and should be interpreted to be as broad as is consistent with the ordinary meaning of the language that is used in the claims when interpreted in light of this specification and the prosecution history that follows and to encompass all structural and functional equivalents. Notwithstanding, none of the claims are intended to embrace subject matter that fails to satisfy the requirement of Sections 101, 102, or 103 of the Patent Act, nor should they be interpreted in such away. Any unintended embracement of such subject matter is hereby disclaimed.

Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various implementations. This is for purposes of streamlining the disclosure and is not to be interpreted as reflecting an intention that the claimed implementations require more features than are expressly recited in each claim. Rather, as the following claims reflect, the inventive subject matter lies in less than all features of a single disclosed implementation. Thus, the following claims are hereby incorporated into the Detailed Description, with each claim standing on its own as a separately claimed subject matter.

While various implementations have been described, the description is intended to be exemplary, rather than limiting and it will be apparent to those of ordinary skill in the art that many more implementations and implementations are possible that are within the scope of the implementations. Although many possible combinations of features are shown in the accompanying figures and discussed in this detailed description, many other combinations of the disclosed features are possible. Any feature of any implementation may be used in combination with or substituted for any other feature or element in any other implementation unless specifically restricted. Therefore, it will be understood that any of the features shown and/or discussed in the present disclosure may be implemented together in any suitable combination. Accordingly, the implementations are not to be restricted except in the light of the attached claims and their equivalents. Also, various modifications and changes may be made within the scope of the attached claims.

What is claimed is:

1. A method for fabricating porous wire-in-tube (WiT) nanostructures, comprising:
   forming a first porous core-shell nanostructure, forming the first porous core-shell nanostructure comprising:
      forming a porous layer on a semi-conductive core by depositing a first plurality of particles on the semi-conductive core, forming the porous layer comprising obtaining a plurality of unmasked regions, each of the plurality of unmasked regions comprising a portion of a surface of the semi-conductive core, the surface not covered with one or more of the first plurality of particles; and
generating an initial porous semi-conductive core of the first porous core-shell nanostructure by etching the plurality of unmasked regions of the semi-conductive core simultaneously with forming the porous layer;
forming a second porous core-shell nanostructure comprising increasing thickness and porosity of the first porous core-shell nanostructure by repeating an iterative process until the thickness of the porous layer reaches a predefined threshold, the iterative process comprising:
increasing the thickness of the porous layer by depositing a second plurality of particles on the initial porous semi-conductive core; and
generating a secondary porous semi-conductive core of the second porous core-shell nanostructure by etching the plurality of unmasked regions of the initial porous semi-conductive core simultaneously with depositing the second plurality of particles; and
forming a porous WiT nanostructure by etching the secondary porous semi-conductive core of the second porous core-shell nanostructure.

2. The method of claim 1, wherein depositing the first plurality of particles on the semi-conductive core comprises:
generating a plurality of metal particles by placing a metal electrode in a plasma environment with plasma power between 100 W and 300 W; and
sputtering the plurality of metal particles on the semi-conductive core by exposing the plurality of metal particles to a mixture of $O_2/H_2$ gases.

3. The method of claim 2, wherein placing the metal electrode in the plasma environment comprises placing at least one of an aluminum (Al) electrode, and a titanium (Ti) electrode in the plasma environment.

4. The method of claim 2, wherein exposing the plurality of metal particles to the mixture of $O_2/H_2$ gases comprises introducing the mixture of $O_2/H_2$ gases to the plurality of metal particles for duration between 10 seconds and 100 seconds.

5. The method of claim 1, wherein etching the plurality of unmasked regions of the semi-conductive core simultaneously with forming the porous layer comprises exposing the porous layer to a mixture of $O_2/H_2$ and a fluorine-containing gas for less than 7 seconds.

6. The method of claim 1, wherein etching the plurality of unmasked regions of the semi-conductive core simultaneously with forming the porous layer comprises introducing a mixture of $O_2/H_2/SF_6$ gases to the porous layer.

7. The method of claim 1, wherein etching the secondary porous semi-conductive core comprises exposing the secondary porous semi-conductive core to a fluorine-containing gas for duration between 10 seconds and 50 seconds with a flow rate between 100 sccm and 300 sccm and plasma power between 100 W and 300 W.

8. The method of claim 1, wherein repeating the iterative process until the thickness of the porous layer reaches the predefined threshold comprises repeating the iterative process until the thickness of the porous layer reaches a value less than 1000 nm.

9. The method of claim 8, wherein repeating the iterative process until the thickness of the porous layer reaches the predefined threshold comprises repeating the iterative process until the thickness of the porous layer reaches a value between 1 nm and 20 nm.

10. The method of claim 1, wherein depositing the porous layer on the semi-conductive core comprises depositing the porous layer on at least one of a silicon core, a germanium core, and combinations thereof.

11. The method of claim 1, wherein depositing the porous layer on the semi-conductive core comprises depositing the porous layer with nanosized pores on the semi-conductive core.

12. The method of claim 1, wherein depositing the porous layer on the semi-conductive core comprises depositing the porous layer on a nanowire with a diameter between 10 nm and 500 nm.

13. A system for fabricating porous wire-in-tube (WiT) nanostructures, the system comprising:
a main chamber, comprising:
a substrate holding a semi-conductive core, the semi-conductive core comprising at least one of a silicon core and a germanium core; and
a pair of parallel metal electrodes, comprising:
a top electrode configured to generate a plurality of metal particles, the top electrode comprising at least one of an aluminum (Al) electrode and a titanium (Ti) electrode; and
a ground electrode configured to hold the substrate; and
a gas source of a plurality of gas sources, the gas source configured to contain at least one gas of a plurality of gases, the plurality of gases comprising $O_2$, $H_2$, and a fluorine-containing gas, the fluorine-containing comprising sulfur hexafluoride ($SF_6$);
a gas inlet configured to introduce a mixture of the plurality of gases into the main chamber;
a gas valve of a plurality of gas valves, the gas valve configured to couple the gas inlet with a respective gas source of the plurality of gas sources;
a vacuum pump configured to generate a vacuum inside the main chamber; and
a radiofrequency generator configured to generate a plasma environment with a plasma power between 100 W and 300 W in the vacuum;
a memory having processor-readable instructions stored therein; and
one or more processors configured to access the memory and execute the processor-readable instructions, which, when executed by the one or more processors configures the one or more processors to perform a method, the method comprising:
forming a first porous core-shell nanostructure, forming the first porous core-shell nanostructure comprising:
forming a porous layer on a semi-conductive core by depositing a first plurality of particles on the semi-conductive core, forming the porous layer comprising obtaining a plurality of unmasked regions, each of the plurality of unmasked regions comprising a portion of a surface of the semi-conductive core, the surface not covered with one or more of the first plurality of particles; and
generating an initial porous semi-conductive core by etching the plurality of unmasked regions of the semi-conductive core simultaneously with forming the porous layer;
forming a second porous core-shell nanostructure comprising increasing thickness and porosity of the first porous core-shell nanostructure by repeating an iterative process until the thickness of the porous layer reaches a predefined threshold, the iterative process comprising:
  increasing the thickness of the porous layer by depositing a second plurality of particles on the semi-conductive core; and
  generating a secondary porous semi-conductive core by etching the plurality of unmasked regions of the semi-conductive core simultaneously with depositing the second plurality of particles; and
forming a porous WiT nanostructure by etching the secondary porous semi-conductive core.

14. The system of claim 13, wherein depositing the first plurality of particles on the semi-conductive core comprises:
  generating a plurality of metal particles by placing the top electrode in the plasma environment; and
  sputtering the plurality of metal particles on the semi-conductive core, comprising introducing a mixture of $O_2$ and $H_2$ to the plurality of metal particles for duration between 10 seconds and 100 seconds by adjusting each respective gas valve of the plurality of gas valves.

15. The system of claim 13, wherein etching the plurality of unmasked regions of the semi-conductive core simultaneously with depositing the porous layer comprises introducing a mixture of $O_2$, $H_2$, and a fluorine-containing gas to the porous layer for duration less than 7 seconds by adjusting each respective gas valve of the plurality of gas valves.

16. The system of claim 13, wherein etching the secondary porous semi-conductive core comprises introducing the fluorine-containing gas to the secondary porous semi-conductive core with a flow rate between 100 sccm and 300 sccm for duration between 10 seconds and 50 seconds by adjusting each respective gas valve of the plurality of gas valves.

17. A wire-in-tube nanostructure, comprising:
  a porous nanotube;
  a semi-conductive nanowire enclosed within the porous nanotube; and
  a gap between the porous nanotube and the semi-conductive nanowire.

18. The wire-in-tube nanostructure of claim 17, wherein:
  the porous nanotube has a thickness between 1 nm and 20 nm; and
  the semi-conductive nanowire has a diameter between 10 nm and 500 nm.

19. The wire-in-tube nanostructure of claim 17, wherein:
  the porous nanotube comprises at least one of alumina, titanium dioxide, and combinations thereof; and
  the semi-conductive nanowire comprises at least one of silicon, germanium, and combinations thereof.

20. The wire-in-tube nanostructure of claim 17, wherein:
  the porous nanotube comprises an amorphous structure; and
  the semi-conductive nanowire comprises a crystalline structure.

* * * * *